(12) United States Patent
Yamanaka

(10) Patent No.: US 6,996,386 B2
(45) Date of Patent: Feb. 7, 2006

(54) AUTOMATIC GAIN CONTROL CIRCUIT CONTROLLING GAIN OF RECEIVER INCLUDING TWO AUTOMATIC GAIN CONTROL AMPLIFIERS

(75) Inventor: Kazuya Yamanaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 496 days.

(21) Appl. No.: 10/378,964

(22) Filed: Mar. 5, 2003

(65) Prior Publication Data

US 2004/0048592 A1 Mar. 11, 2004

(30) Foreign Application Priority Data

Sep. 6, 2002 (JP) .............................. 2002-261291

(51) Int. Cl.
*H04B 1/06* (2006.01)
(52) U.S. Cl. .............................. 455/234.2; 455/241.1; 455/245.2; 455/247.1; 455/240.1; 375/345
(58) Field of Classification Search ............ 455/240.1, 455/247.1, 241.1, 232.1, 234.1, 234.2, 245.2, 455/251.1, 253.2; 375/345
See application file for complete search history.

(56) References Cited

U.S. PATENT DOCUMENTS

| | | | | | |
|---|---|---|---|---|---|
| 5,745,847 | A | * | 4/1998 | Matsuo ..................... | 455/234.1 |
| 5,758,271 | A | * | 5/1998 | Rich et al. ................ | 455/234.1 |
| 5,946,607 | A | * | 8/1999 | Shiino et al. ............. | 455/234.1 |
| 6,044,253 | A | * | 3/2000 | Tsumura ................... | 455/234.1 |
| 6,498,927 | B2 | * | 12/2002 | Kang et al. ............... | 455/245.2 |
| 6,564,043 | B2 | * | 5/2003 | Rauhala ..................... | 455/251.1 |
| 6,603,825 | B1 | * | 8/2003 | Pecen ......................... | 375/345 |
| 6,728,524 | B2 | * | 4/2004 | Yamanaka et al. ........ | 455/232.1 |
| 6,771,719 | B1 | * | 8/2004 | Koyama et al. ............ | 375/345 |

FOREIGN PATENT DOCUMENTS

| | | |
|---|---|---|
| JP | 11-504183 | 4/1999 |
| JP | 2000-209118 A | 7/2000 |
| JP | 2001-285104 A | 10/2001 |

* cited by examiner

*Primary Examiner*—Edward F. Urban
*Assistant Examiner*—Adeel Haroon
(74) *Attorney, Agent, or Firm*—Buchanan Ingersoll PC

(57) ABSTRACT

An A-rail circuit outputs a control signal AGCOUTA whereas a B-rail circuit outputs a control signal AGCOUTB in an AGC circuit. AGCOUTA controls an AGC amplifier (A) while AGCOUTB controls an AGC amplifier (B). A difference value between a power of an input signal and (an amount of variable adjustment SWEEP+a power reference value AGCR). If an output signal of a loop filter in the A-rail circuit attains AGCARAIL>AGCATOB, AGCARAIL=AGCATOB is fixed, and AGCBRAIL is adjusted based on the difference value. If an output signal of a loop filter in the B-rail circuit attains AGCBRAIL<AGCBTOA, AGCBRAIL=AGCBTOA is fixed, and AGCARAIL is adjusted based on the difference value. A control circuit in the AGC circuit acquires a bit error rate, identifies a value of SWEEP allowing a minimum bit error rate, and fixes the value of SWEEP at the identified value.

14 Claims, 23 Drawing Sheets

FIG.10

| A | B | C | Y |
|---|---|---|---|
| 0 | 1 | 0 | 0 |
| 1 | 1 | 0 | 0 |
| 0 | 1 | 1 | 1 |
| 0 | 0 | 1 | 0 |

FIG.11

| A | B | C | SELOUT |
|---|---|---|--------|
| — | — | 0 | 0 |
| 0 | 1 | 1 | 1 |
| 1 | 0 | 1 | 0 |
| 0+ (N OR MORE TIMES OF CONTINUOUS A=0) | 0 | 1 | 0 |
| 0- (LESS THAN N TIMES OF CONTINUOUS A=0) | 0 | 1 | 1 |
| 1+ (N OR MORE TIMES OF CONTINUOUS A=1) | 1 | 1 | 1 |
| 1- (LESS THAN N TIMES OF CONTINUOUS A=1) | 1 | 1 | 0 |

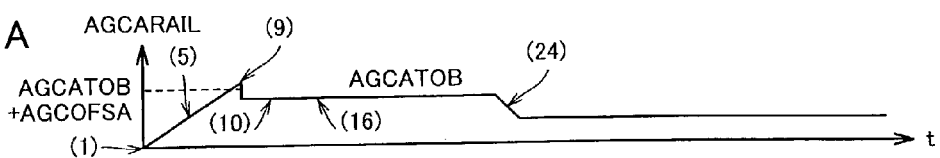
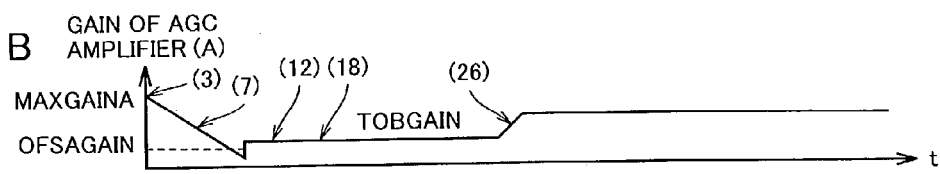
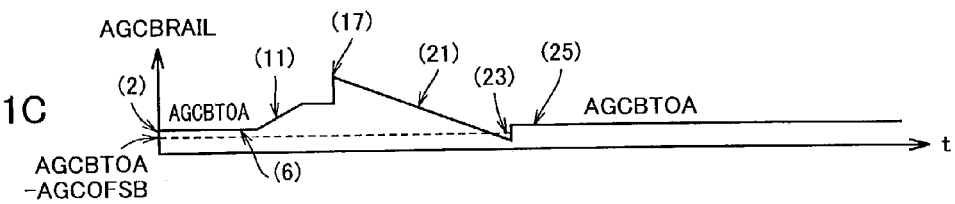
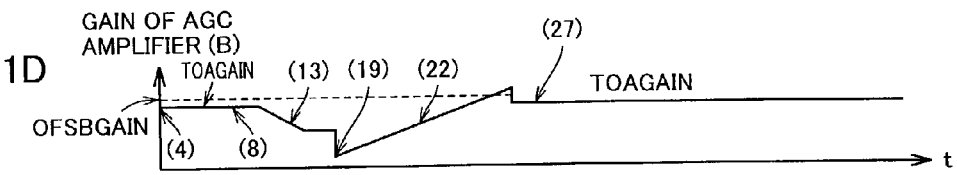
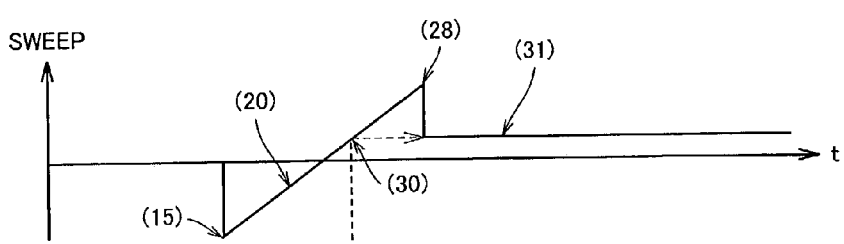
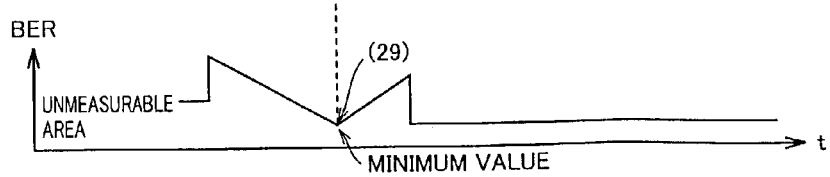

AUTOMATIC GAIN CONTROL CIRCUIT CONTROLLING GAIN OF RECEIVER INCLUDING TWO AUTOMATIC GAIN CONTROL AMPLIFIERS

BACKGROUND OF THE INVENTION

1. Field of the Invention

The present invention relates to an automatic gain control circuit, and more particularly, to an automatic gain control circuit controlling a gain of a receiver including two automatic gain control amplifiers.

2. Description of the Background Art

A receiver and the like performing digital modulation includes an automatic gain control amplifier (hereinafter referred to as an AGC amplifier) and an automatic gain control circuit (hereinafter referred to as an AGC circuit) controlling the gain of the AGC amplifier.

A receiver shown in FIG. 23 includes an antenna 123, a tuner 101, a bandpass filter 102, an AGC amplifier (A) 120, a frequency converter 103, an oscillator 104, an A/D converter 105, a demodulation circuit 514 and an error correction circuit 199.

Antenna 123 receives a radio frequency (RF) signal of a high frequency transmitted via a transmission path such as a ground wave, a satellite wave or a cable. Tuner 101 includes an AGC amplifier (B) 130, which amplifies the radio frequency (RF) signal output by antenna 123. Moreover, tuner 101 selects a signal of a desired channel from the amplified radio frequency (RF) signal and converts the signal into an intermediate frequency (IF) signal of 30 MHz–50 MHz.

Bandpass filter 102 only allows the component of the intermediate frequency (IF) to pass through. AGC amplifier (A) 120 amplifies the intermediate frequency (IF) signal. Oscillator 104 outputs a constant frequency signal. Frequency converter 103 mixes the constant frequency signal output by oscillator 104 and the intermediate frequency (IF) signal amplified at AGC amplifier (B) 130 to output a baseband signal.

A/D converter 105 converts the analog baseband signal into a digital baseband signal and sends the converted signal to demodulation circuit 514. A/D converter 105 is required to have a constant input amplitude in order to maintain constant conversion accuracy.

Error correction circuit 199 corrects an error in a bit string by a forward error correction method (hereinafter abbreviated as FEC). Error correction circuit 199 commences error correcting operation when A/D converter 105 obtains a constant input amplitude.

Demodulation circuit 514 includes a multiplier 115, a multiplier 116, an LPF (Low Pass Filter) 106, an LPF 107, a derotator 108, a decoder 109, an NCO (Numerical Control Oscillator) 111, a loop filter 112, a phase comparator 113, an AGC circuit 99 and a control circuit 98.

Multiplier 115 multiplies the baseband signal with a signal of a fixed frequency having a sine waveform output from a local oscillator to extract a symbol of an I-axis component of an input signal. Multiplier 116 multiplies the baseband signal with a signal of a fixed frequency having a cosine waveform output from the local oscillator to extract a symbol of a Q-axis component of an input signal.

LPF 106 and LPF 107 are low pass filters having the same frequency characteristic and performing spectrum shaping. Phase comparator 113 predicts an ideal symbol for the input symbol and detects a phase difference between these symbols.

Loop filter 112 performs smoothing of the detected phase difference and sends the result to NCO 111. NCO 111 is a numerical control oscillator, which sends sine and cosine wave signals each having a frequency proportional to the input smoothed phase difference to derotator 108. Derotator 108 is a complex multiplier, which receives the sine and cosine wave signals sent from NCO 111 and adjusts a phase shift and a frequency drift in the symbols. Decoder 109 converts symbol information into a bit string.

AGC circuit 99 sends a control signal AGCOUT controlling the gains of AGC amplifier (A) 120 and AGC amplifier (B) 130 such that A/D converter 105 has a constant input amplitude.

FIG. 24 shows the configuration of AGC circuit 99. Referring to FIG. 24, AGC circuit 99 includes a square-sum operation circuit 3, a square-root operation circuit 4, an adder 6, a multiplier 57, an adder 58, an AND circuit 59, a D-type flip-flop 60, a digital-analog converter (DAC) 61 and a control circuit 98.

Control circuit 98 sets values of AGCR and AGCG based on an entry for setting by the user. AGCR is an ideal power value of an input signal defined on a modulation method basis. AGCG is a value for adjusting an absolute value having the magnitude of control signal AGCOUT sent to AGC amplifier (A) 120 and AGC amplifier (B) 130. After power input, control circuit 98 sets a reset signal RST="0" for reset execution, and thereafter sets reset signal RST="1" for reset release.

Square-sum operation circuit 3 calculates a square sum of AGCIN (symbol information for the I-axis and Q-axis) output from LPF 106 and LPF 107. Square-root operation circuit 4 calculates a square root of a square sum of AGCIN, i.e. a power P of an input signal. Adder 6 performs subtraction on power P of the input signal and (AGCR), to output (P−AGCR). Multiplier 57 multiplies (P−AGCR) with AGCG to output {(P−AGCR)×AGCG}.

Adder 58, AND circuit 59 and D-type flip-flop 60 form a loop filter. The loop filter outputs "0" if RST="0," and averages outputs of multiplier 57, i.e. the values of {(P−AGCR)×AGCG}, for output if RST="1."

Digital-analog converter (DAC) 61 outputs control signal AGCOUT obtained by converting the output signal of the loop filter into an analog value to AGC amplifier (A) 120 and AGC amplifier (B) 130.

If the output signal of the loop filter is a minimum value of "0," the gain of AGC amplifier (A) 120 is a maximum value of "MAXGAINA" whereas the gain of AGC amplifier (B) 130 is a maximum value of "MAXGAINB." If the output signal of the loop filter is a maximum value of "1," the gain of AGC amplifier (A) 120 is a minimum value of "MINGAINA" whereas the gain of AGC amplifier (B) 130 is a minimum value of "MINGAINB."

Accordingly, the AGC circuit controls the gains of AGC amplifier (A) 120 and AGC amplifier (B) 130 such that power P of an input signal and an ideal power value AGCR of an input signal defined on a modulation method basis have a small difference (P−AGCR). Thus, AID converter 105 may have a constant input amplitude.

The input signal, however, includes a large amount of noise due to superimposition of a reflected signal of the input signal within the transmission path or undesirable radiation such as spurious. Thus, the calculated power value of the input signal in the AGC circuit described above is not very reliable. Control of the gain of an AGC amplifier based on such a power value would result in an extremely low bit error rate of the bit string output from the demodulation circuit.

In addition, the two AGC amplifiers each has a unique characteristic. For instance, AGC amplifier (B) 130 amplifying a RF signal has a characteristic such that it is preferably used having a gain as close to the maximum gain as possible in order to amplify a received input signal to the size that can be processed in a subsequent stage even if the input signal has a low level.

In the AGC circuit described above, however, the gains of the two AGC amplifiers are controlled such that each of them has a maximum value if the output signal of the loop filter is a minimum value, while the gains of the two AGC amplifiers are controlled such that each gain has a minimum value if the output signal of the loop filter is a maximum value. The two AGC amplifiers cannot be controlled separately.

SUMMARY OF THE INVENTION

An object of the present invention is to provide an AGC circuit that controls the gain of an AGC amplifier so as to have a low bit error rate.

Another object of the present invention is to provide an AGC circuit that separately controls two AGC amplifiers.

According to one aspect of the present invention, an automatic gain control circuit controlling a gain of a receiver including a first automatic gain control amplifier amplifying a RF signal and a second automatic gain control amplifier amplifying an IF signal includes an operation circuit performing addition on a value of an adjustment signal variably adjustable in a prescribed range and a reference value of a power of an input signal input into the receiver, to calculate a difference value between a result of the addition and the power of the input signal input into the receiver, and a control signal adjustment circuit adjusting a value of a control signal controlling a gain of the first automatic gain control amplifier and a gain of the second automatic gain control amplifier, based on the difference value.

As such, the value of the adjustment signal is varied to adjust the gains of the first and second automatic gain control amplifiers so as to have a low bit error rate.

According to another aspect of the present invention, an automatic gain control circuit controlling a gain of a receiver including a first automatic gain control amplifier amplifying a RF signal and a second automatic gain control amplifier amplifying an IF signal includes a control signal adjustment circuit adjusting a value of a first control signal controlling a gain of either one of a first automatic gain control amplifier and a second automatic gain control amplifier and a value of a second control signal controlling a gain of the other one of the first and second automatic gain control amplifiers, and an adjustment instruction circuit instructing adjustment of the value of the second control signal if the value of the first control signal is past a first control value as a result of the control signal adjustment circuit adjusting the value of the first control signal such that a gain of an automatic gain control amplifier controlled by the first control signal decreases, and instructing adjustment of the value of the first control signal if the value of the second control signal is past a second control value as a result of the control signal adjustment circuit adjusting the second control signal such that a gain of an automatic gain control amplifier controlled by the second control signal increases. The control signal adjustment circuit fixes the value of the first control signal at the first control value while adjusting the value of the second control signal if an instruction is given to adjust the value of the second control signal, and fixes the value of the second control signal to the second control value while adjusting the value of the first control signal if an instruction is given to adjust the value of the first control signal.

Accordingly, the gains of the first and second automatic gain control amplifiers can be adjusted separately. Moreover, the value of the first control signal has an end point passing the first control value if the gain is lowered, whereas the start point of the value of the first control signal is the first control value if the gain is raised. In addition, the value of the second control signal has an end point passing the second control value if the gain is raised, whereas the value of the second control signal has a start point at the second control value if the gain is raised. This allows control that is adapted to a hysteresis characteristic of the gain for a control signal in an automatic gain control amplifier.

According to a further aspect of the present invention, an automatic gain control circuit controlling a gain of a receiver including a first automatic gain control amplifier amplifying a RF signal and a second automatic gain control amplifier amplifying an IF signal includes a control signal adjustment circuit adjusting a value of a first control signal controlling either one of the first automatic gain control amplifier and the second automatic gain control amplifier and adjusting a value of a second control signal controlling a gain of the other one of the first and second automatic gain control amplifiers, and an adjustment instruction circuit instructing adjustment of the value of the second control signal if the value of the first control signal is past a first control value as a result of the control signal adjustment circuit adjusting the value of the first control signal such that a gain of an automatic gain control amplifier controlled by the first control signal decreases, and instructing adjustment of the value of the first control signal if the value of the second control signal is past a second control value as a result of the control signal adjustment circuit adjusting the value of the second control signal such that a gain of an automatic gain control amplifier controlled by the second control signal increases. The control signal adjustment circuit fixes the value of the first control signal at a third control value while adjusting the value of the second control signal if an instruction is given to adjust the value of the second control signal, a gain of an automatic gain control amplifier controlled by the first control signal being higher at the third control value than at the first control value. The control signal adjustment circuit fixes the value of the second control signal at a fourth control value while adjusting the value of the first control signal if an instruction is given to adjust the value of the first control signal, a gain of an automatic gain control amplifier controlled by the second signal being lower at the fourth control value than at the second control value.

Thus, when the adjustment of the value of the second control signal is switched to the adjustment of the value of the first control signal, the adjustment start value of the first control signal has a third control value (<the first control value). Even if the value of the first control signal varies to pass the third control value, it can be set not to pass the first control value. This can avoid the problem such that adjustment can be switched back to that of the second control signal, allowing stable switching. Further, when the adjustment of the value of the first control signal is switched to the adjustment of the value of the second control signal, the adjustment start value of the second control signal has a fourth control value (>second control value). Even if the value of the second control signal varies to pass the fourth control value, it can be adjusted so as not to pass the second control value. This can avoid the problem such that adjustment can be switched back to that of the first control signal, allowing stable switching.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 shows an input/output correspondence table illustrating the relation between an input (A, B, C) and an output Y;

FIG. 11 shows an input/output correspondence table illustrating the relation between an input (A, B, C) and an output SELOUT;

FIGS. 21A–21H illustrate AGCARAIL, AGCBRAIL, a gain of AGC amplifier (A) 120, a gain of AGC amplifier (B) 130, an input amplitude of an A/D converter, a value of sweep signal SWEEP and a change in BER with time;

DESCRIPTION OF THE PREFERRED EMBODIMENTS

Embodiments of the present invention will be described below with reference to the drawings.

First Embodiment

The present embodiment relates to an AGC that can adjust a gain based on a bit error rate.

[Configuration]

Figure 1:
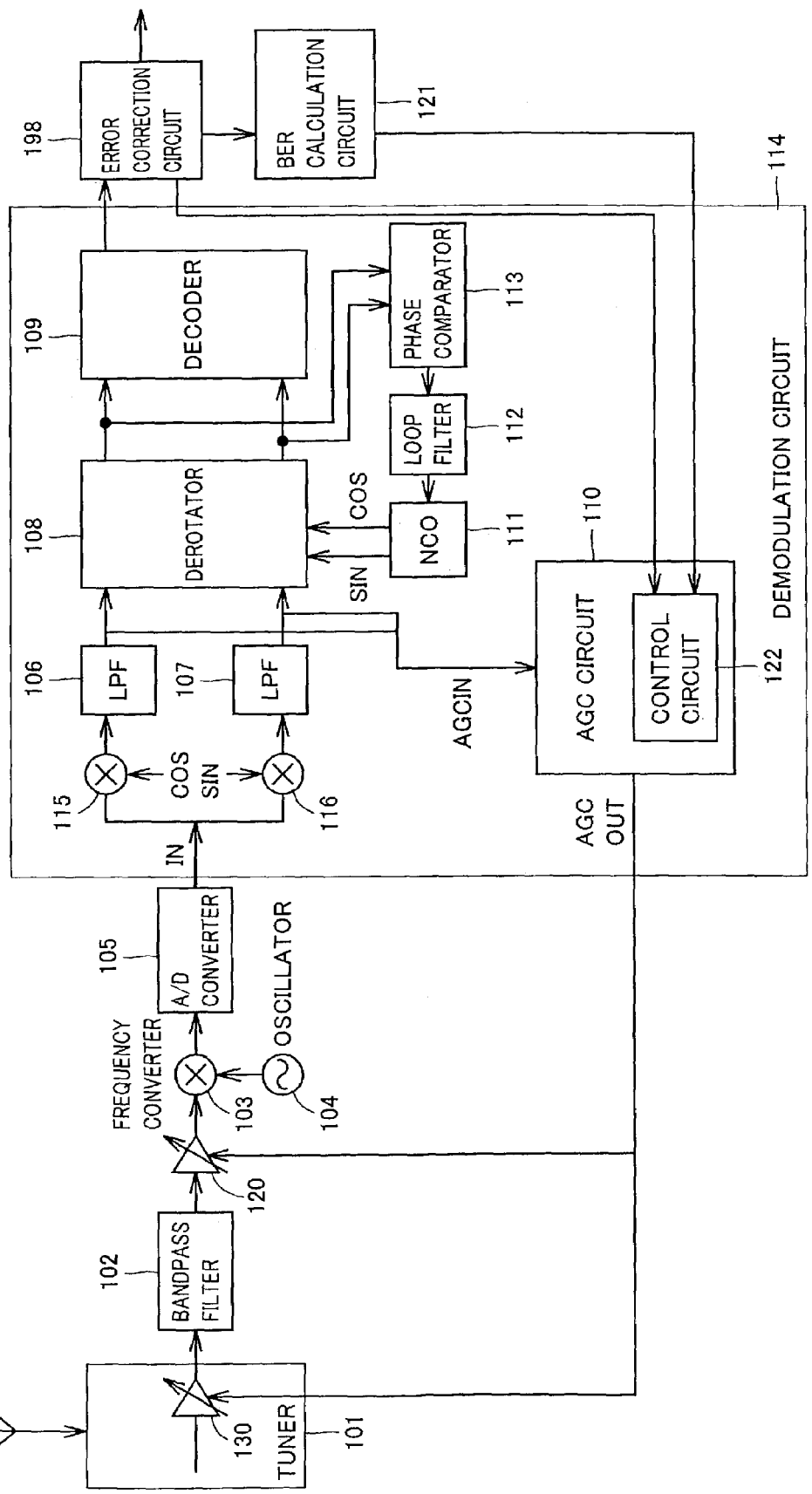
FIG. 1 shows the configuration of a receiver.

A receiver according to the present embodiment shown in FIG. 1 includes an antenna 123, a tuner 101, a bandpass filter 102, an AGC amplifier (A) 120, a frequency converter 103, an oscillator 104, an A/D converter 105, a demodulation circuit 114, an error correction circuit 198 and a BER calculation circuit 121.

Antenna 123 receives a high-frequency radio frequency (RF) signal transmitted via a transmission path such as a ground wave, a satellite wave or a cable. Tuner 101 includes an AGC amplifier (B) 130, which amplifies the radio frequency (RF) signal output by antenna 123. Moreover, tuner 101 selects a signal of a desired channel from the amplified radio frequency (RF) signal and converts the selected signal into an intermediate frequency (IF) signal of 30 MHz–50 MHz.

Bandpass filter 102 only allows the component of the intermediate frequency (IF) to pass through. AGC amplifier (A) 120 amplifies the intermediate frequency (IF) signal. Oscillator 104 outputs a constant frequency signal. Frequency converter 103 mixes the constant frequency signal output from oscillator 104 with the intermediate frequency (IF) signal amplified at AGC amplifier (B) 130, to output a baseband signal.

A/D converter 105 converts the analog baseband signal into a digital baseband signal, and sends the converted signal to demodulation circuit 114.

Error correction circuit 198 corrects an error in a bit string by FEC, and transmits error information including the number of transmission bits and the number of error bits to BER calculation circuit 121. Error correction circuit 198 commences the error correction operation when A/D converter 105 obtains a constant input amplitude. When the error correction operation is commenced, error correction circuit 198 performs a prescribed operation to examine if an error is correctable, and if it becomes correctable, i.e., when FEC is converged, error correction circuit 198 informs BER calculation portion 121 and control circuit 122 thereof.

After FEC is converged at error correction circuit 198, BER calculation portion 121 receives error information from error correction circuit 198 and calculates the number of error bits/the number of transmission bits, to obtain BER (bit error rate) and output it to control circuit 122.

Figure 23:
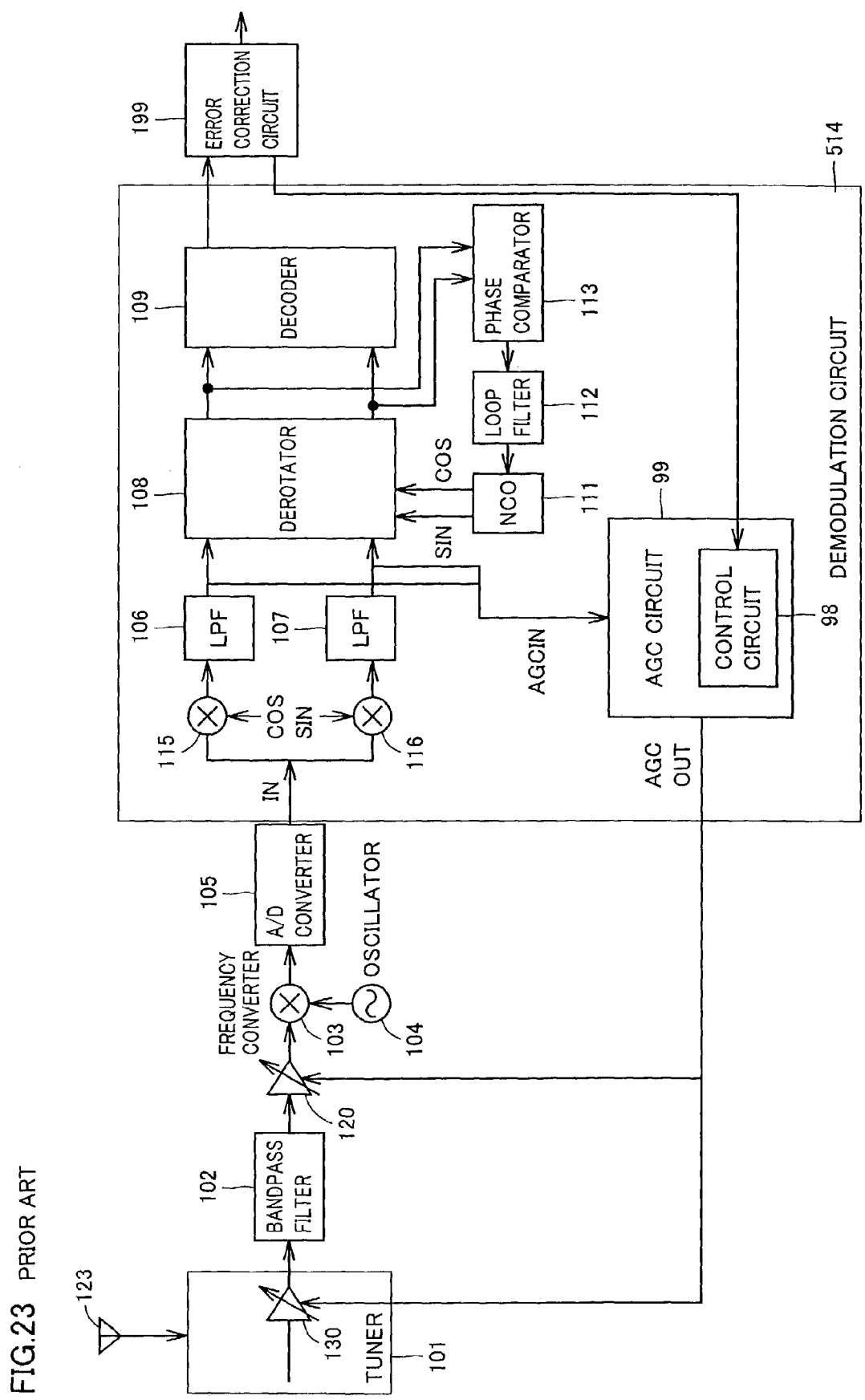
FIG. 23 shows the configuration of a conventional receiver.
Figure 24:
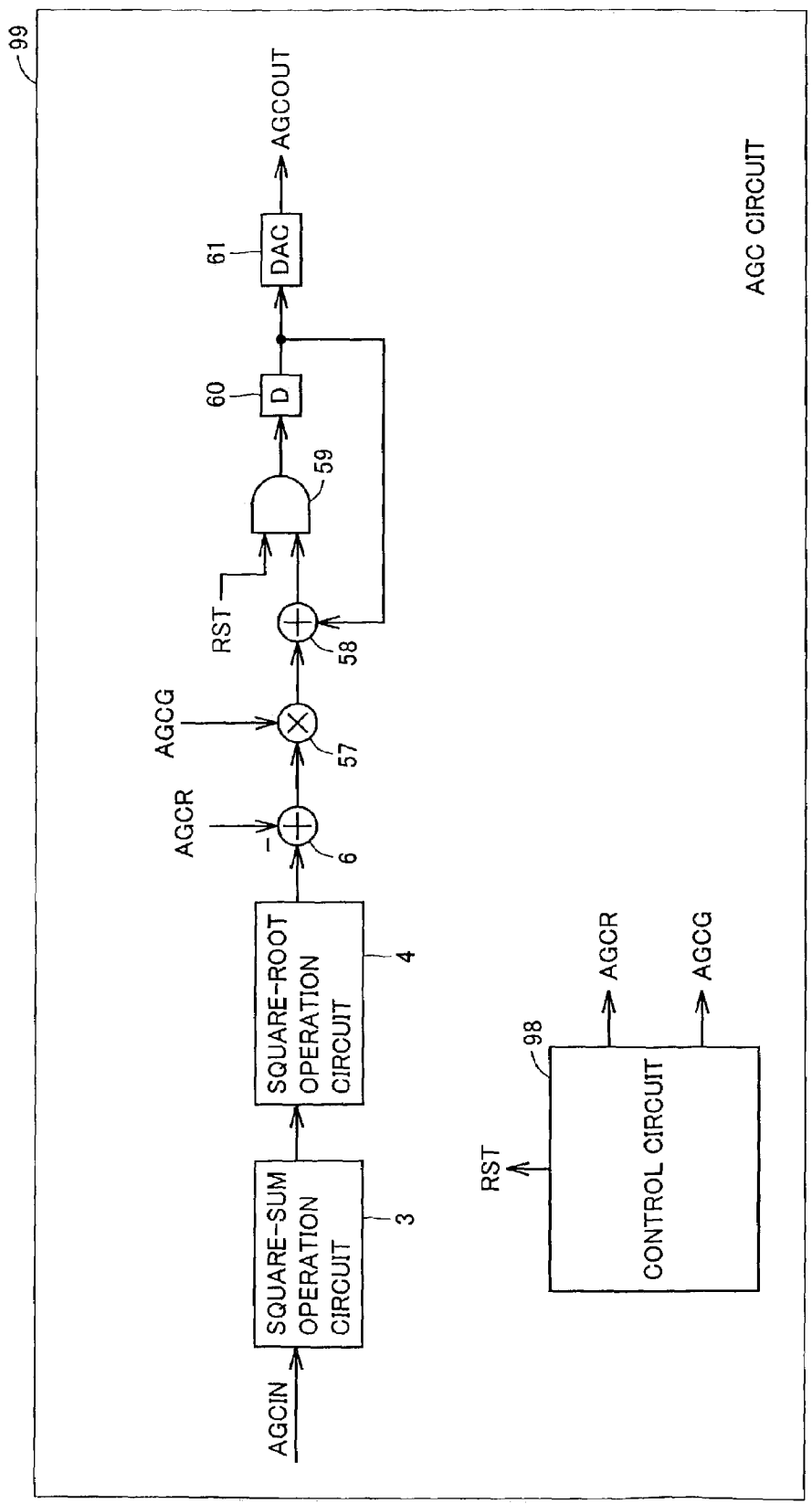
FIG. 24 shows the configuration of the conventional AGC circuit.

Demodulation circuit 114 includes a multiplier 115, a multiplier 116, an LPF 106, an LPF 107, a derotator 108, a decoder 109, an NCO 111, a loop filter 112, a phase comparator 113, an AGC circuit 110 and a control circuit 122. The components other than AGC circuit 110 and control circuit 122 are similar to those in the conventional demodulation circuit shown in FIG. 23, so that description thereof will not be repeated.

AGC circuit 110 receives outputs from LPF 106 and LPF 107. AGC circuit 110 sends control signal AGCOUT to AGC amplifier (A) 120 and AGC amplifier (B) 130, which controls their gains such that A/D converter 105 has a constant input amplitude.

Figure 2:
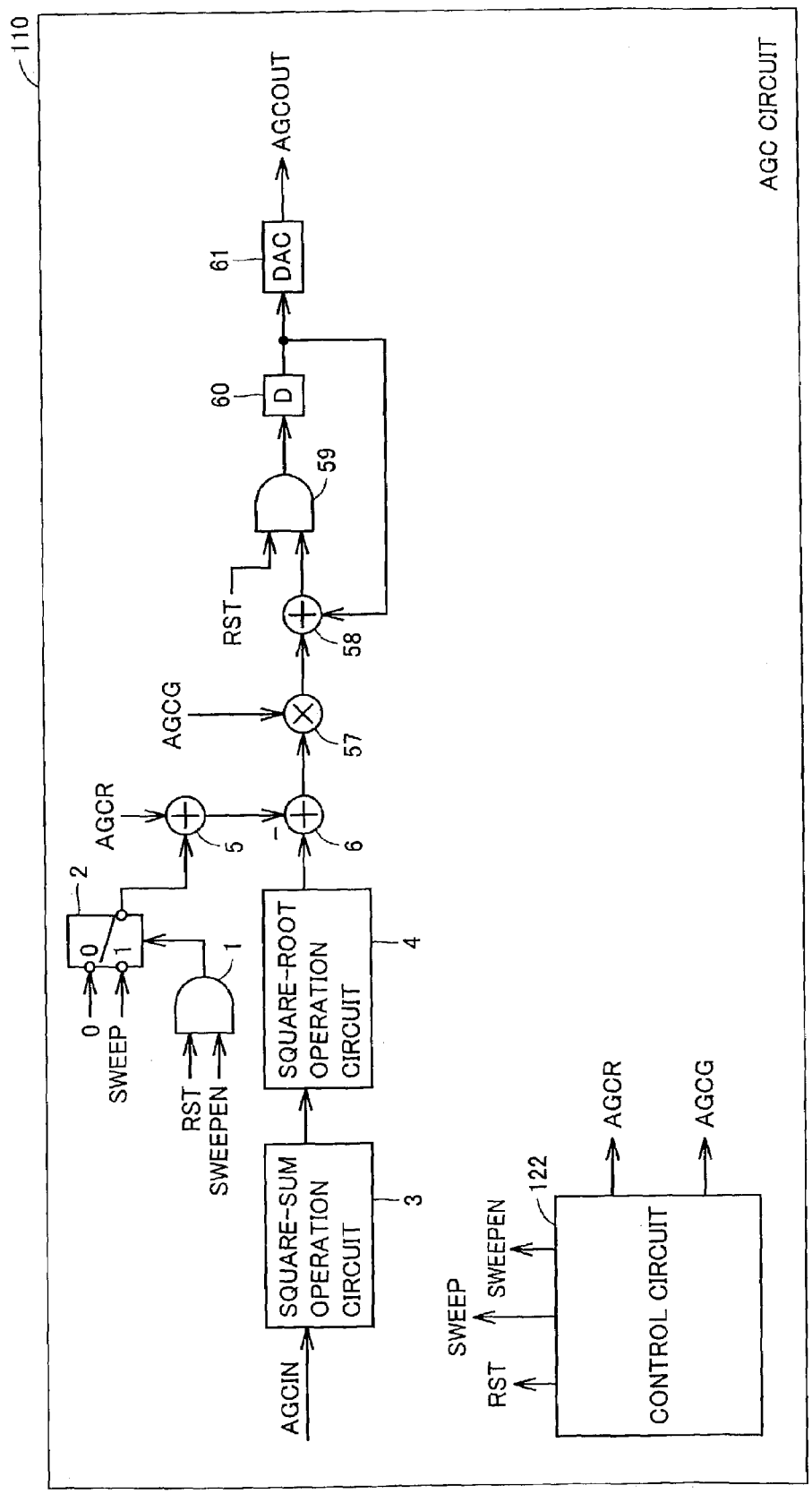
FIG. 2 shows the configuration of an AGC circuit.

AGC circuit 110 shown in FIG. 2 includes an AND circuit 1, a selector 2, a square-sum operation circuit 3, a square-root operation circuit 4, an adder 5, an adder 6, a multiplier 57, an adder 58, an AND circuit 59, a D-type flip-flop 60, a digital-analog converter (DAC) 61 and a control circuit 122.

Control circuit 122 sets the values of AGCR and AGCG based on an entry for setting by the user. AGCR is an ideal power value of an input signal defined on a modulation method basis. AGCG is a value for adjusting an absolute value having the magnitude of control signal AGCOUT (which will be described later) to be sent to AGC amplifier (A) 120 and AGC amplifier (B) 130.

In addition, control circuit 122 controls the values of reset signal RST, a sweep enable signal SWEEPEN and sweep signal SWEEP.

After power input, control circuit 122 sets reset signal RST="0" for reset execution, and thereafter sets reset signal RST="1" for reset release.

After FEC is converged at error correction circuit 198, control circuit 122 sets sweep enable signal SWEEPEN="1."

After FEC is converged at error correction circuit 198, control circuit 122 gradually increases the value of sweep signal SWEEP from the lower limit to the upper limit within a determined range. Sweep signal SWEEP is an adjustable signal. A change in the value of sweep signal SWEEP causes a change in control signal AGCOUT output from AGC circuit 110, thereby changing the gains of AGC amplifier (A) 120 and AGC amplifier (B) 130. The change in the gains of AGC amplifier (A) 120 and AGC amplifier (B) 130 then causes a change in a bit error rate (BER). Control circuit 122 stores the set value of sweep signal SWEEP and BER obtained by the value of sweep signal SWEEP in association with each other. If the value of sweep signal SWEEP reaches the upper limit within the determined range, control circuit 122 searches for the smallest value in the stored BER to identify the value of SWEEP corresponding to that BER. Control circuit 122 fixes the identified value of sweep signal SWEEP as a value of sweep signal SWEEP to be input into AGC circuit 110.

AND circuit 1 outputs "1" if reset signal RST="1" and sweep enable signal SWEEPEN="1," and outputs "0" otherwise.

Selector 2 outputs a value of sweep signal SWEEP "SWEEP" if the output of the AND circuit is "1," and outputs "0" if the output of the AND circuit is "0."

Square-sum operation circuit 3 calculates a square sum of AGCIN (symbol information for the I-axis and the Q-axis). Square-root operation circuit 4 calculates a square root of a square sum of AGCIN, i.e. a power P of an input signal.

Adder 5 performs an addition on "AGCR" and "0" or "SWEEP" to output (AGCR) or (AGCR+SWEEP).

Adder 6 performs a subtraction on power P of the input signal and (AGCR) or (AGCR+SWEEP) to output (P–AGCR) or {P–(SWEEP+AGCR)}.

Multiplier 57 multiplies (P–AGCR) or {P–(SWEEP+AGCR)} with AGCG to output {(P–AGCR)×AGCG} or {(P–(SWEEP+AGCR))×AGCG}.

Adder 58, AND circuit 59 and D-type flip-flop 60 form a loop filter. The loop filter outputs "0" if RST="0," and it averages outputs of multiplier 57, i.e. the values of {(P–AGCR)×AGCG)} or {(P–(SWEEP+AGCR))×AGCG}, for output.

Figure 3A:
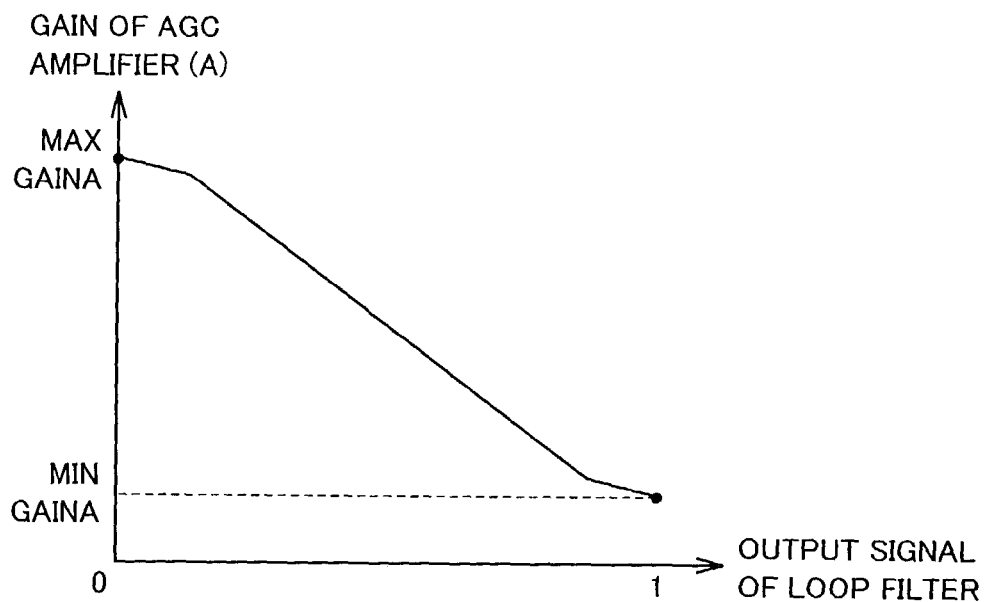
FIG. 3A shows the relation between an output signal of a loop filter and a gain of an AGC amplifier (A) 120.
Figure 3B:
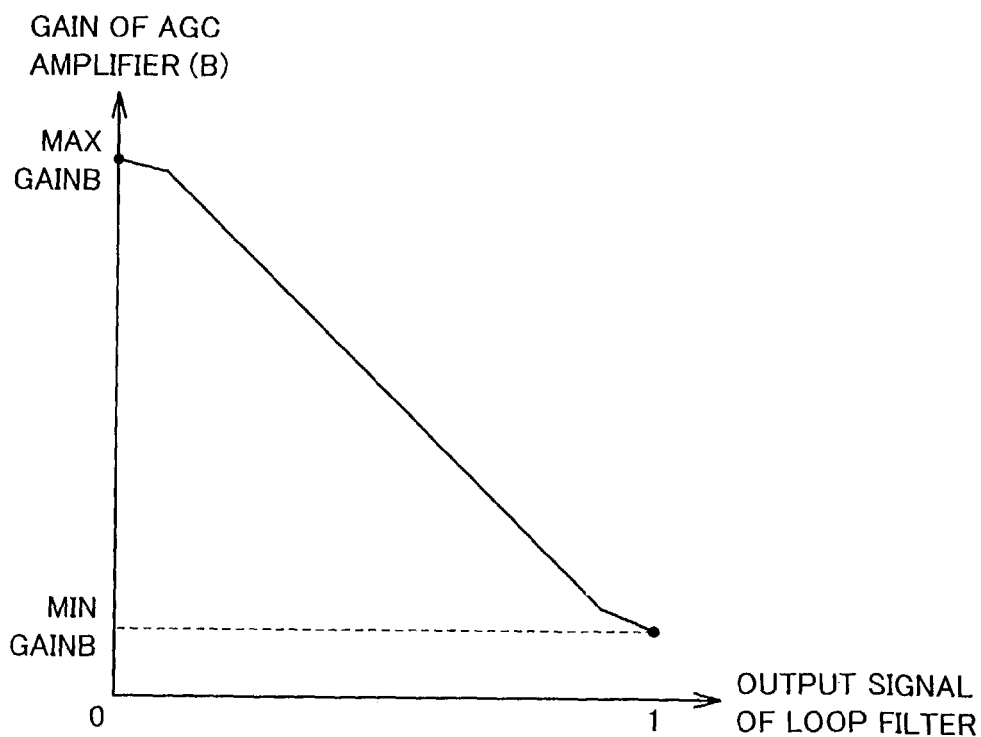
FIG. 3B shows the relation between an output signal of a loop filter and a gain of AGC amplifier (B) 130.

Digital-analog converter (DAC) 61 outputs control signal AGCOUT obtained by converting the output signal of the loop filter into an analog value to AGC amplifier (A) 120 and AGC amplifier (B) 130. As shown in FIGS. 3A and 3B, if the output signal of the loop filter is a minimum value of "0," the gain of AGC amplifier (A) 120 is a maximum value of "MAXGAINA" whereas the gain of AGC amplifier (B) 130 is a maximum value of "MAXGAINB." If the output signal of the loop filter is a maximum value of "1," the gain of AGC amplifier (A) 120 is a minimum value of "MINGAINA" whereas the gain of AGC amplifier (B) 130 is a minimum value of "MINGAINB."

[Operation]

Figure 4:
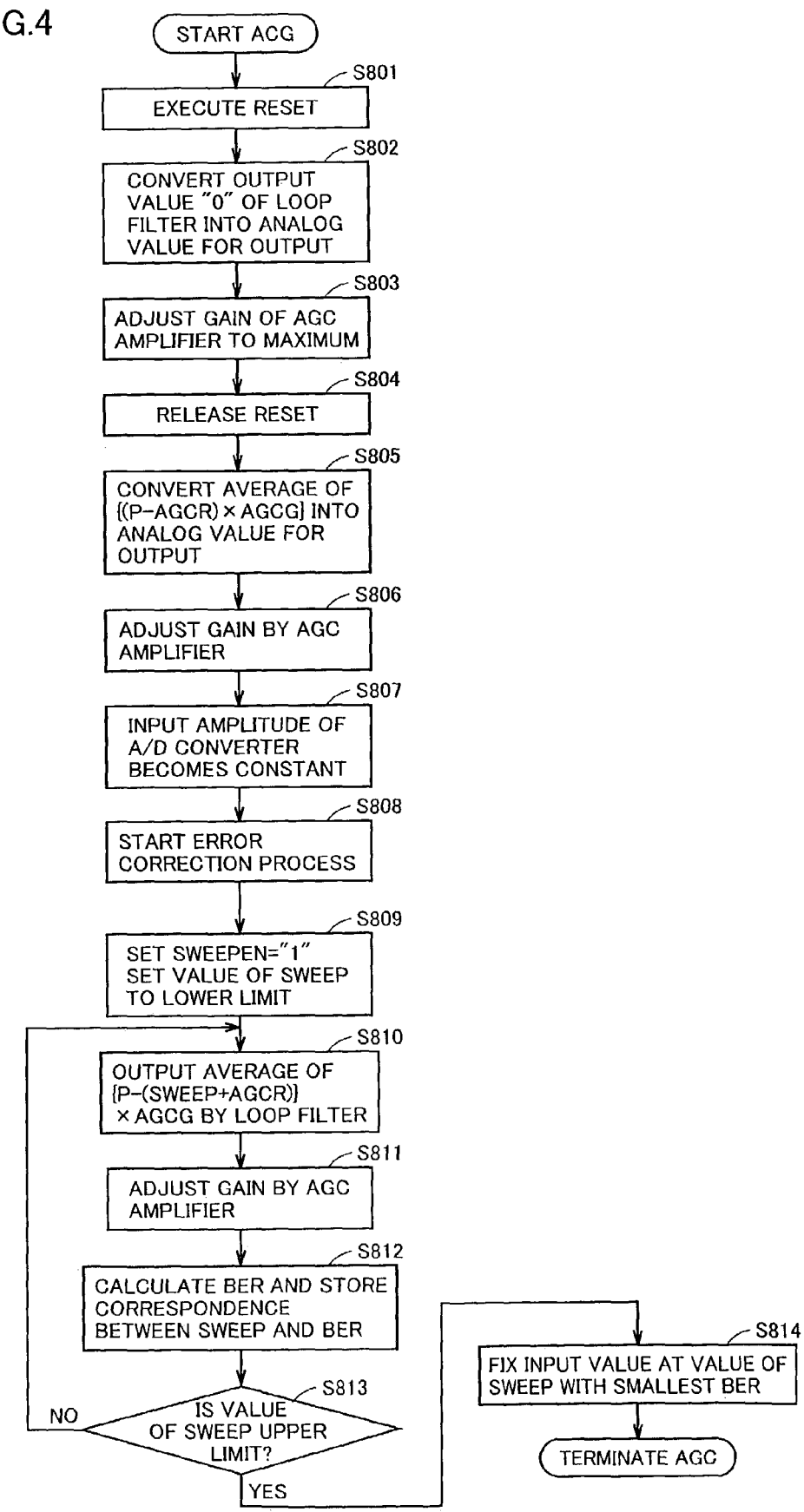
FIG. 4 shows a flow chart illustrating an AGC process procedure.

The operation of AGC is now described with reference to the AGC process procedure illustrated in FIG. 4 as well as an output signal of the loop filter, gains of AGC amplifier (A) 120 and AGC amplifier (B) 130, an input amplitude of the A/D converter, a value of sweep signal SWEEP, and a change in BER with time that are illustrated in FIGS. 5A–5G.

After power input, control circuit 122 sets reset signal RST="0" for reset execution. This sets a selection signal of selector 2 to "0" (step S801).

Figure 5A:
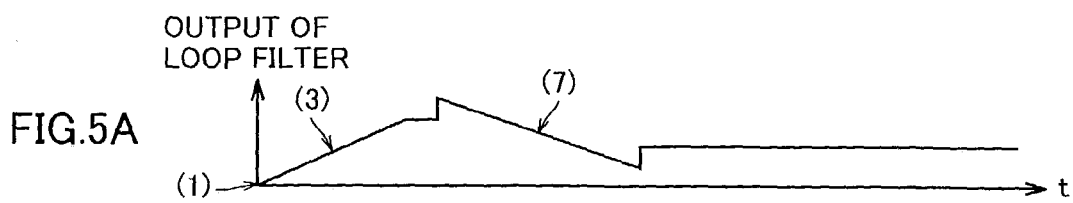
FIGS. 5A–5G illustrate the output signal of the loop filter, gains of AGC amplifier (A) 120 and AGC amplifier (B) 130, an input amplitude of an A/D converter, a value of a sweep signal SWEEP, and a change in BER with time.

The loop filter formed by adder 58, AND circuit 59 and D-type flip-flop 60 outputs "0" based on RST="0" (indicated by (1) in FIG. 5A). Digital-analog converter (DAC) 61 outputs AGCOUT obtained by converting the output signal "0" of the loop filter into an analog value to AGC amplifier (A) 120 and AGC amplifier (B) 130 (step S802).

Figure 5B:
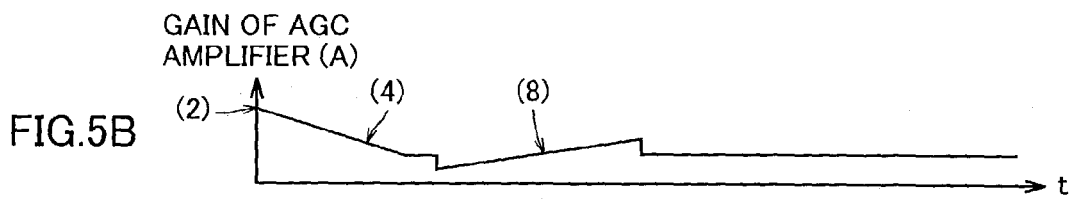
Figure 5C:
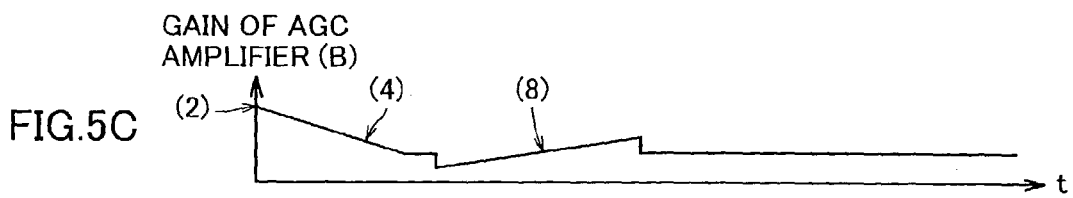
Figure 5D:
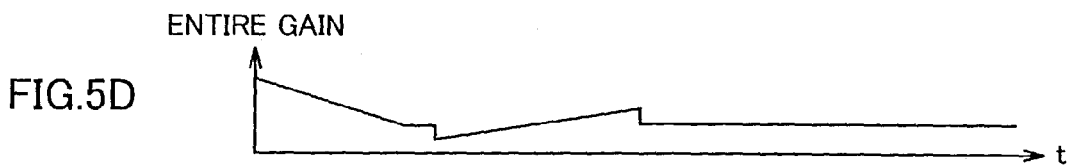

At AGC amplifier (A) 120 and AGC amplifier (B) 130, control signal AGCOUT adjusts the gains to a value corresponding to the output signal "0" of the loop filter, i.e. a maximum value "MAXGAIN" (indicated by (2) in FIGS. 5B and 5C) (step S803).

Subsequently, control circuit 122 sets reset signal RST to "1" for reset release. A selection signal of selector 2, however, has "0" because sweep enable signal SWEEPEN=0 (step S804).

Adder 5 performs an addition on "0" and AGCR to output AGCR. Square-sum operation circuit 3 calculates a square sum of AGCIN (symbol information for the I-axis and Q-axis). Square-root operation circuit 4 calculates a square root of the calculated square sum, i.e. power P of the input signal. Adder 6 performs a subtraction on power P of the input signal and AGCR to output (P–AGCR). Multiplier 57 multiplies (P–AGCR) with AGCG to output {(P–AGCR)×AGCG}. The loop filter formed by adder 58, AND circuit 59 and D-type flip-flop 60 averages the values of {(P–AGCR)×AGCG} for output, if RST="1." It is assumed here that the value of the output signal of the loop filter increases (indicated by (3) in FIG. 5A). Digital-analog converter (DAC) 61 outputs control signal AGCOUT obtained by converting the averaged value of {(P–AGCR)×AGCG} which is the output signal of the loop filter into an analog value, to AGC amplifier (A) 120 and AGC amplifier (B) 130 (step S805).

At each of AGC amplifier (A) 120 and AGC amplifier (B) 130, control signal AGCOUT adjusts the gain to decrease from "MAXGAIN" in association with increase in the value of the output signal of the loop filter (indicated by (4) in FIGS. 5B and 5C) (step S806).

Figure 5E:
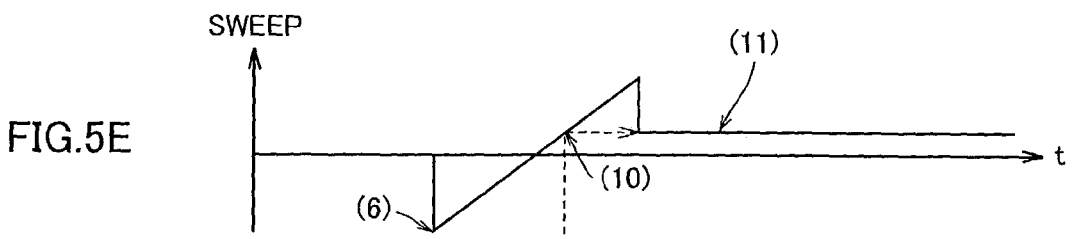
Figure 5F:
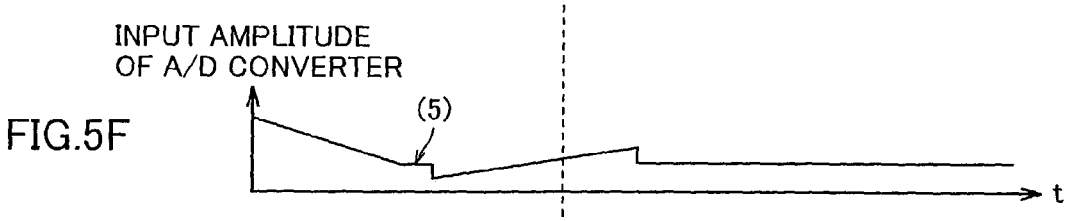

The processes at steps S805 and S806 are repeated, resulting that A/D converter 105 has a constant input amplitude (indicated by (5) in FIG. 5F) (step S807).

When A/D converter 105 obtains a constant input amplitude, error correction circuit 198 commences error correcting operation. If FEC is converged so as to attain a stage where BER can be measured, error correction circuit 198 informs BER calculation portion 121 and control circuit 122 thereof (step S808).

When reaching a stage where BER can be measured, control circuit 122 sets sweep enable signal SWEEPEN to "1," and the value of sweep signal SWEEP to the lower limit within a determined range (indicated by (6) in FIG. 5E).

Based on sweep enable signal SWEEPEN="1," a selection signal of selector 2 has a value "SWEEP" of sweep signal SWEEP. Adder 5 performs an addition on "SWEEP" and "AGCR" to output (SWEEP+AGCR). Adder 6 performs a subtraction on power P of the input signal and (SWEEP+AGCR) to output {P−(SWEEP+AGCR)}. Multiplier 57 multiplies {P−(SWEEP+AGCR)} with AGCG, to output {P−(SWEEP+AGCR)}×AGCG. The loop filter formed by adder 58, AND circuit 59 and D-type flip-flop 60 averages the values of {P−(AGCR+SWEEP)}×AGCG for output if RST="1." Here, it is assumed that the value of the output signal of the loop filter decreases (indicated by (7) in FIG. 5A). Digital-analog converter (DAC) 61 outputs control signal AGCOUT obtained by converting the averaged value of {P−(SWEEP+AGCR)}×AGCG which is an output signal of the loop filter into an analog value, to AGC amplifier (A) 120 and AGC amplifier (B) 130 (step S810).

At AGC amplifier (A) 120 and AGC amplifier (B) 130, control signal AGCOUT adjusts the gain to increase in association with decrease in the value of the output signal of the loop filter (indicated by (8) in FIGS. 5B and 5C) (step S811).

A change in the gains of AGC amplifier (A) 120 and AGC amplifier (B) 130 causes a change in the input amplitude of A/D converter 105. A bit error rate (BER) changed thereby is calculated by BER calculation portion 121. Control circuit 122 then stores the set value of sweep signal SWEEP and the value of BER obtained thereby in association with each other (step S812).

Control circuit 122 gradually increases the value of sweep signal SWEEP within a determined range. Control circuit 122 then repeats the processes at steps S810 to S812 and terminates the processes at steps S810 to S812 when the value of sweep signal SWEEP reaches the upper limit within the determined range (step S813).

Figure 5G:
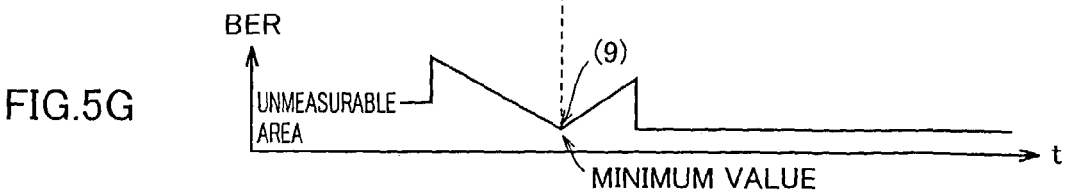

Control circuit 122 searches for the smallest value in the stored BER (indicated by (9) in FIG. 5G) and identifies the value of SWEEP corresponding to that BER (indicated by (10) in FIG. 5E). Control circuit 122 fixes the identified value of sweep signal SWEEP as a value of sweep signal SWEEP to be input into AGC circuit 110 (indicated by (11) in FIG. 5E) (step S814).

As described above, in the automatic gain control circuit according to the present embodiment, the gains of AGC amplifier (A) 120 and AGC amplifier (B) 130 can be adjusted so as to have the lowest bit error rate by changing the value of sweep signal SWEEP.

[Modification]

The present invention is not limited to the embodiment above, but naturally includes the modification as described below for example.

(1) Relation Between Output Value of Loop Filter and Gain of AGC Amplifier

While the present embodiment describes that the gain of an AGC amplifier decreases as the output value of the loop filter increases, it is not limited thereto. The gain of the AGC amplifier may increase as the output value of the loop filter increases. Same can also be applied to the following embodiments.

(2) Control Circuit, BER Calculation Portion

While the present embodiment describes that a control circuit is included in the AGC circuit, the control circuit may also be provided external to the AGC circuit. Moreover, though the BER calculation portion is provided external to the AGC circuit in the present embodiment, it may also be provided within the AGC circuit. Same can be applied to the following embodiments.

(3) Adjustment of SWEEP Signal

According to the present embodiment, control circuit 122 sets the value of sweep signal SWEEP to gradually increase from the lower limit to the upper limit within a determined range, and stores the set value of sweep signal SWEEP and BER obtained based on the value of sweep signal SWEEP in association with each other. Control circuit 122 then searches for BER having the smallest value to identify the value of SWEEP corresponding to that BER. It is, however, not limited thereto, and may be associated with operation by the user as follows. The user sets the value of sweep signal SWEEP to an arbitrary value and displays BER obtained by the value of sweep signal SWEEP. The user changes the value of sweep signal SWEEP and identifies the value of SWEEP that corresponds to a small BER while viewing the value of BER obtained thereby. The user then fixes the identified value of sweep signal SWEEP as a value of sweep signal SWEEP to be input into AGC circuit 110.

Second Embodiment

The present embodiment relates to an AGC that generates a control signal for controlling two AGC amplifiers separately.

[Configuration]

Figure 6:
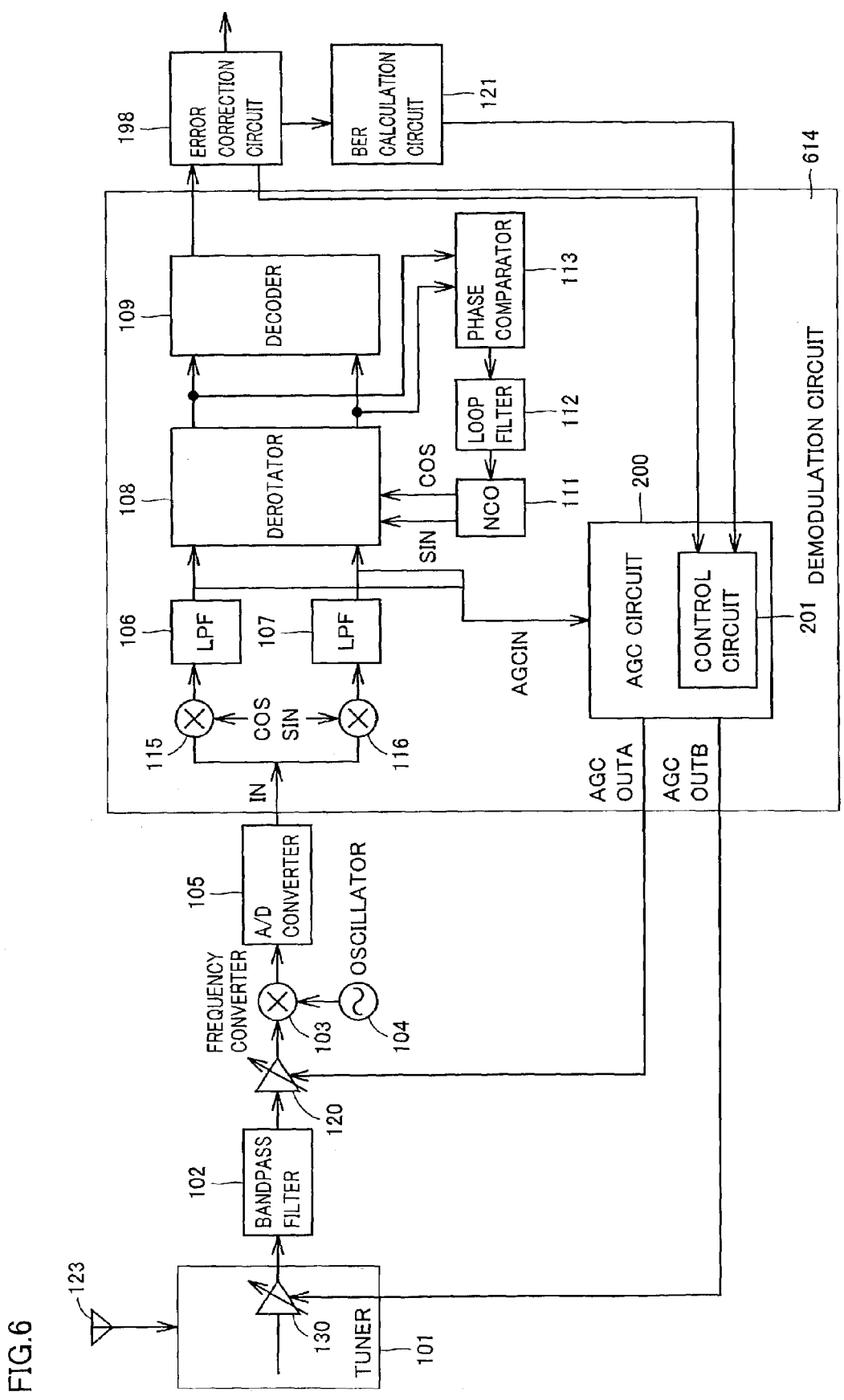
FIG. 6 shows the configuration of a receiver.

A receiver according to the present embodiment shown in FIG. 6 is different from the receiver according to the first embodiment shown in FIG. 1 in that the AGC circuit outputs different control signals to AGC amplifier (A) 120 and to AGC amplifier (B) 130 respectively.

Figure 7:
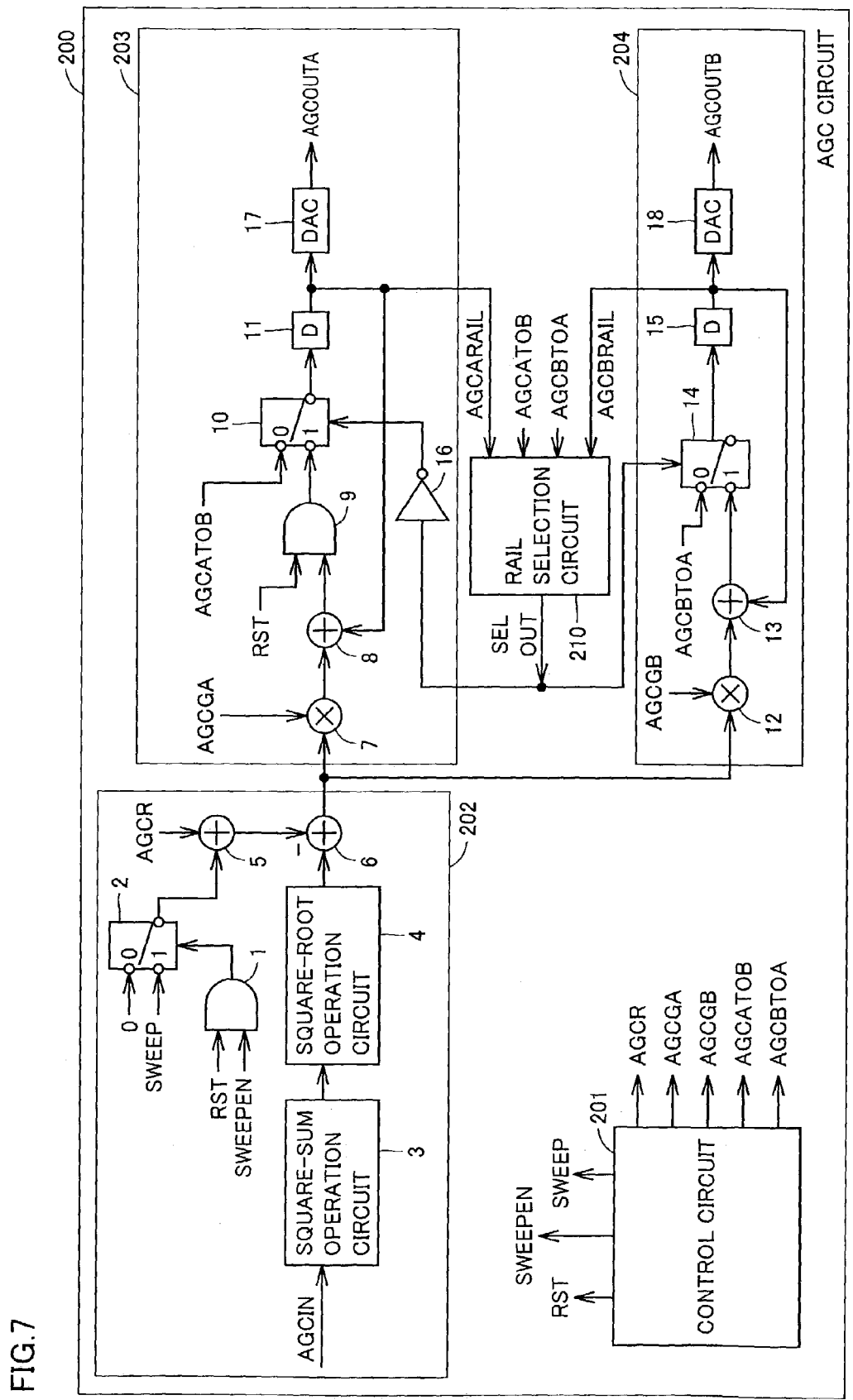
FIG. 7 shows the configuration of an AGC circuit.

An AGC circuit 200 shown in FIG. 7 outputs a control signal AGCOUTA to AGC amplifier (A) 120 and a control signal AGCOUTB to AGC amplifier (B) 130. AGC circuit 200 is constituted by an A-rail circuit 203 that involves generation of control signal AGCOUTA controlling the gain of AGC amplifier (A) 120, a B-rail circuit 204 that involves generation of control signal AGCOUTB controlling the gain of AGC amplifier (B) 130, a both rail common circuit 202 that involves generation of the both control signals, a rail selection circuit 210 that selects one of the control signals to be adjusted in its value, and a control circuit 201.

Control circuit 201 is approximately the same as control circuit 122 in the first embodiment, except that control circuit 201 further performs setting of AGCGA, AGCGB, AGCATOB, and AGCBTOA, based on an entry for setting by the user. AGCGA is a value for adjusting an absolute value having the magnitude of control signal AGCOUTA that is to be sent to AGC amplifier (A) 120. AGCGB is a value for adjusting an absolute value having the magnitude of control signal AGCOUTB that is to be sent to AGC amplifier (B) 130.

AGCATOB indicates a point at which adjustment is switched from that of the value of control signal AGCOUTA to that of the value of control signal AGCOUTB. AGCBTOA indicates a point at which adjustment is switched from that of the value of control signal AGCOUTB to that of the value of control signal AGCOUTA. AGCATOB and AGCBTOA will be described later in detail. It is noted that adjustment of the value of control signal AGCOUTA is referred to as selection of an A-rail circuit, while adjustment of the value of control signal AGCOUTB is referred to as selection of a B-rail circuit.

Both-rail common circuit 202 includes AND circuit 1, selector 2, square-sum operation circuits 3, square-root operation circuit 4, adder 5, and multiplier 6. Each of these components are the same as those in the first embodiment.

A-rail circuit 203 includes a multiplier 7, an adder 8, an AND circuit 9, a selector 10, a D-type flip-flop 11, a digital-analog converter (DAC) 17, and an inverter 16.

Multiplier 7 multiplies (P–AGCR) or {P–(SWEEP+AGCR)} output by adder 6 with AGCGA, to output {(P–AGCR)×AGCGA} or {P–(SWEEP+AGCR)×AGCGA}.

Adder 8, AND circuit 9, selector 10, and D-type flip-flop 11 form a loop filter. The loop filter outputs "0" if reset signal RST="0," outputs "AGCATOB" if rail selection signal SELOUT="1," and averages outputs of multiplier 7, i.e. the values of {(P–AGCR)×AGCGA} or {(P–(SWEEP+AGCR))×AGCGA} for output if reset signal RST="1" and rail selection signal SELOUT="0." The output signal of the loop filter is designated as AGCARAIL. Here, reset signal RST is "1" when the reset is executed and is "0" when the reset is released. Rail selection signal SELOUT is "0" if the A-rail circuit is selected and is "1" if the B-rail circuit is selected.

Digital-analog converter (DAC) 17 outputs control signal AGCOUTA obtained by converting output signal AGCARAIL of the loop filter into an analog value, to AGC amplifier (A) 120.

Figure 8A:
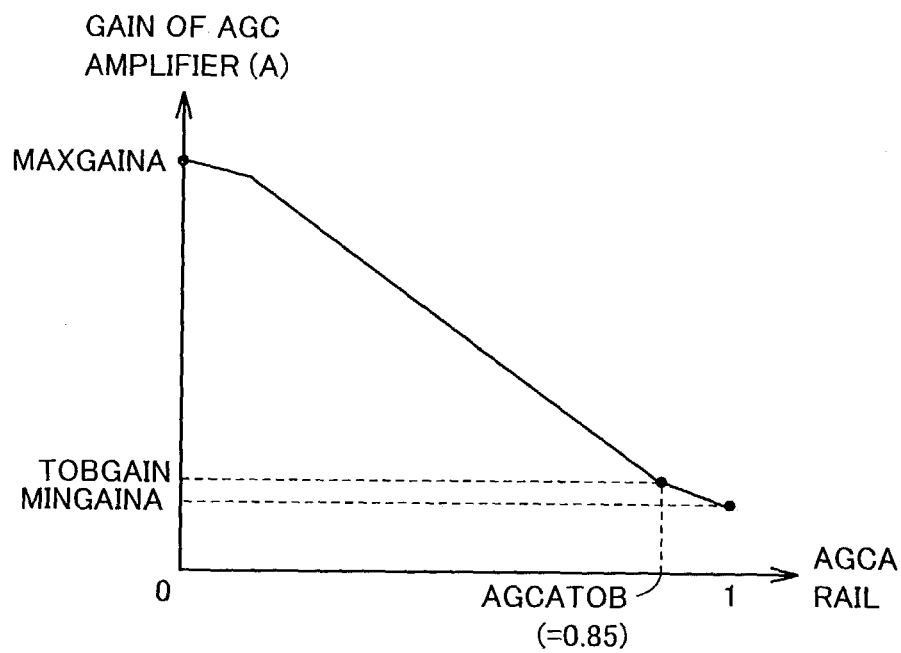
FIG. 8A shows the relation between an output signal AGCARAIL of a loop filter and a gain of AGC amplifier (A) 120.

As can be seen from FIG. 8A, the gain of AGC amplifier (A) 120 comes to be a maximum value of "MAXGAINA" if output signal AGCARAIL of the loop filter is a minimum value of "0," whereas the gain of AGC amplifier (A) comes to be a minimum value of "MINGAINA" if output signal AGCARAIL of the loop filter is a maximum value of "1." Moreover, if output signal AGCARAIL of the loop filter is "AGCATOB" indicating the point of switching selection of rail circuits, the gain of AGC amplifier (A) 120 is "TOBGAIN." "TOBGAIN" assumes a value close to "MINGAINA" and having gain characteristics such as a low degree of distortion and less tendency to have noise (i.e. stable gain characteristics). Here, a high degree of distortion means that the relation between the input and the output of an AGC amplifier shows a non-linear characteristic due to saturation.

B-rail circuit 204 includes a multiplier 12, an adder 13, a selector 14, a D-type flip-flop 15, and a digital-analog converter (DAC) 18.

Multiplier 12 multiplies (P–AGCR) or {P–(SWEEP+AGCR)} output by adder 6 with AGCGB, to output {(P–AGCR)×AGCGB} or {(P–(SWEEP+AGCR))×AGCGB}.

Adder 13, selector 14 and D-type flip-flop 15 form a loop filter. The loop filter outputs "AGCBTOA" if rail selection signal SELOUT="0" and averages outputs of multiplier 12, i.e. the values of {(P–AGCR)×AGCGB} or {(P–(SWEEP+AGCR))×AGCGB}, for output if rail selection signal SELOUT="1." The output signal of the loop filter is designated as AGCBRAIL.

Here, rail selection signal SELOUT is "0" if the A-rail circuit is selected and "1" if the B-rail circuit is selected.

Digital-analog converter (DAC) 18 outputs control signal AGCOUTB obtained by converting output signal AGCBRAIL of the loop filter into an analog value, to AGC amplifier (B) 130.

Figure 8B:
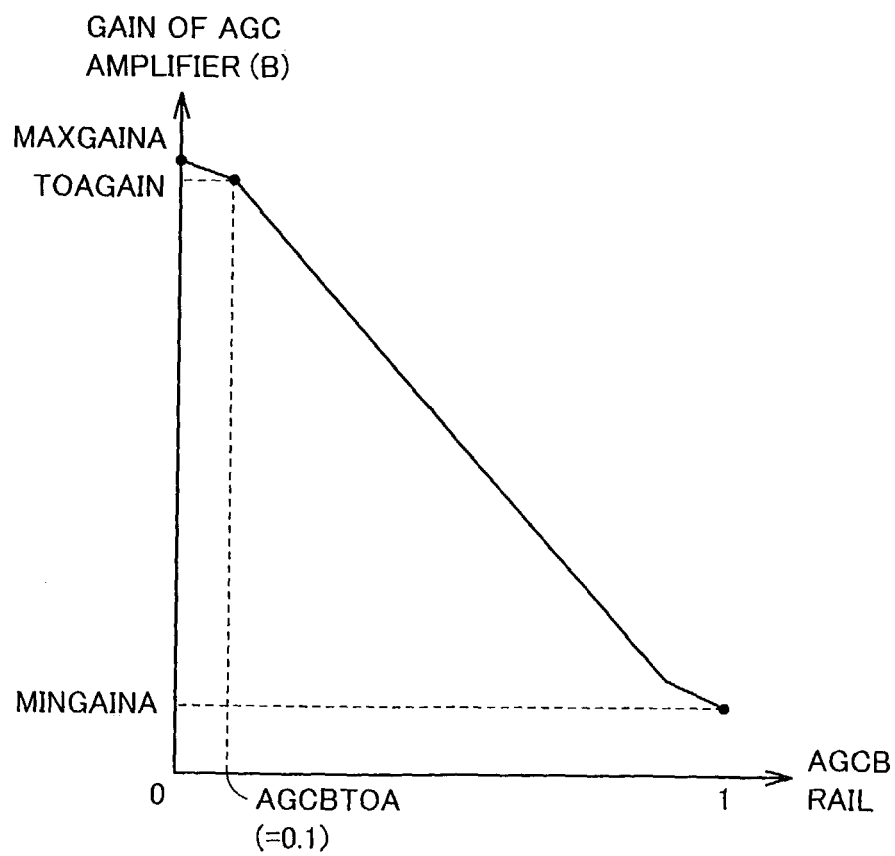
FIG. 8B shows the relation between an output signal AGCBRAIL of a loop filter and a gain of AGC amplifier (B) 130.

As can be seen from FIG. 8B, the gain of AGC amplifier (B) 130 is a maximum value of "MAXGAINB" if output signal AGCBRAIL of the loop filter is a minimum value of "0," whereas the gain of AGC amplifier (B) is a minimum value of "MINGAINB" if output signal AGCBRAIL of the loop filter is a maximum value of "1." In addition, the gain of AGC amplifier (B) 130 is "TOAGAIN" if output signal AGCBRAIL of the loop filter is "AGCBTOA," i.e. a point at which selection of A-rail circuit is switched. It is assumed that "TOAGAIN" is a value close to "MAXGAINB" and having gain characteristics such as a low degree of distortion and less tendency to have noise (i.e. stable gain characteristics).

Figure 9:
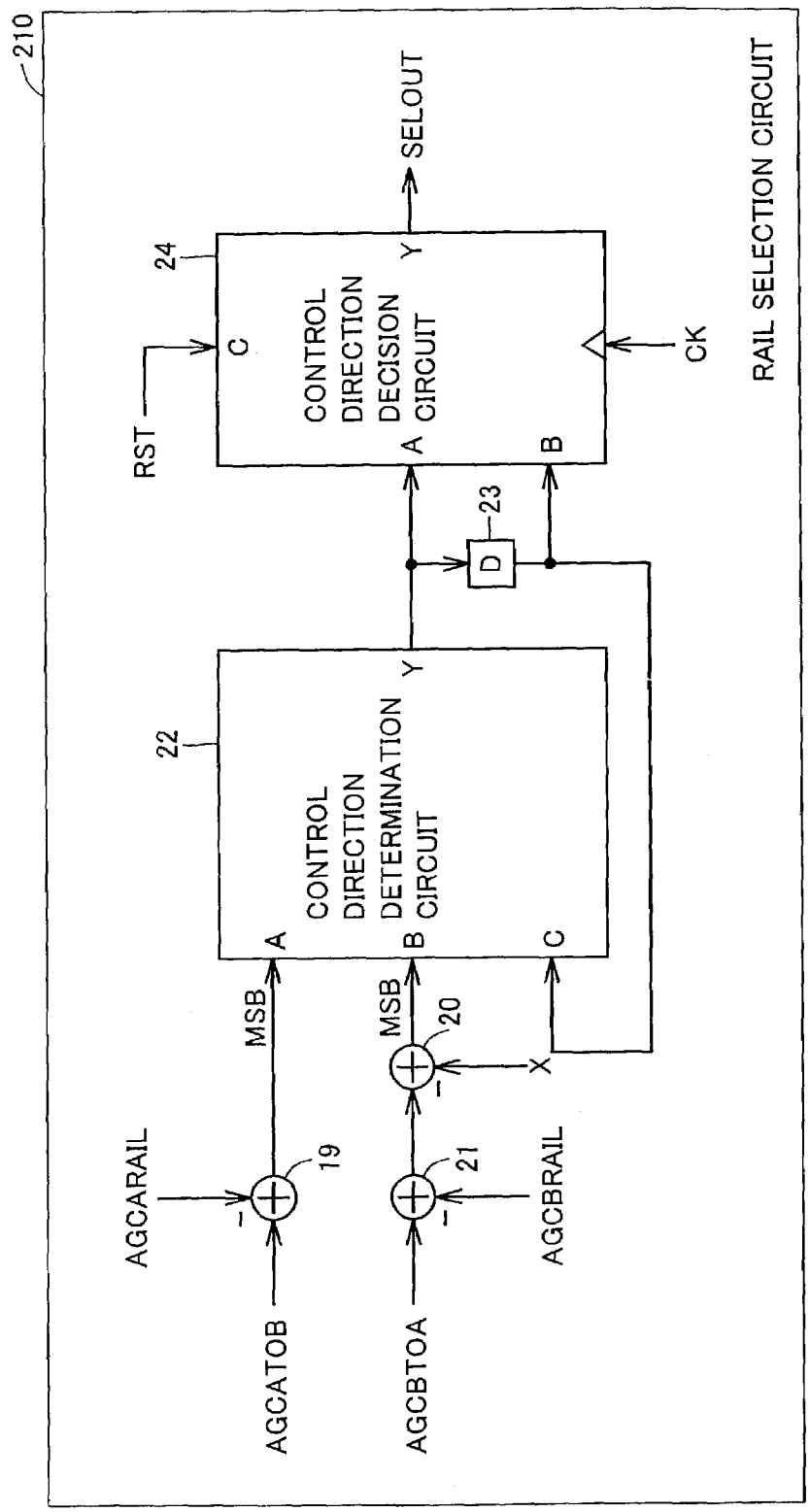
FIG. 9 shows the configuration of a rail selection circuit.

Rail selection circuit 210 shown in FIG. 9 includes an adder 19, an adder 20, an adder 21, a control direction determination circuit 22, a D-type flip-flop 23, and a control direction decision circuit 24.

Adder 19 performs subtraction on AGCATOB and output signal AGCARAIL of the loop filter in the A-rail circuit, to output (AGCATOB–AGCARAIL).

Adder 21 performs subtraction on AGCBTOA and output signal AGCBRAIL of the loop filter in the B-rail circuit, to output (AGCBTOA–AGCBRAIL).

Adder 20 performs subtraction on (AGCBTOA–AGCBRAIL) and X, to output (AGCBTOA–AGCBRAIL–X). The value of X is a value in which only the least significant bit (hereinafter referred to as LSB) is 1, i.e. the smallest positive value. Adder 20 is provided to output a negative value when AGCBRAIL=AGCBTOA is established.

Adders 19, 20 and 21 perform operation in a two's complement form. Thus, the most significant bit (hereinafter referred to as MSB) has a value of 0 if an operation result is 0 or a positive value, whereas MSB has a value of 1 if the operation result is a negative value.

Control direction determination circuit 22 receives inputs A, B and C, and outputs a determination signal Y. Input A is MSB of an output of adder 20. Input B is MSB of an output of adder 21. Input C is an output of the D-type flip-flop, i.e. determination signal Y in an immediately preceding cycle. Determination signal Y being "0" urges control direction decision circuit 24 to select the A-rail circuit, while determination signal Y being "1" urges control direction decision circuit 24 to select the B-rail circuit.

An input/output correspondence table shown in FIG. 10 indicating the relation between inputs (A, B, C) and output Y is now described. (A, B, C)=(0, 1, 0) indicates that AGCARAIL≦AGCATOB and AGCBRAIL>(AGCBTOA–X) (i.e. AGCBRAIL≧AGCBTOA) are established, and that determination signal Y that urges selection of the A-rail circuit had been output in the immediately preceding cycle. This indicates a state where AGCARAIL is not past "AGCATOB" in the A-rail circuit and AGCBRAIL is fixed at "AGCBTOA" in the B-rail circuit. Accordingly, determination signal Y is set to "0" so as to instruct selection of the A-rail circuit in order to adjust the gain of the AGG amplifier (A).

(A, B, C)=(1, 1, 0) indicates that AGCARAIL>AGCATOB and AGCBRAIL>(AGCBTOA–X) (i.e. AGCBRAIL≧AGCBTOA) are established, and that determination signal Y urging selection of the A-rail circuit had been output in the immediately preceding cycle. This indicates a state where AGCARAIL is past "AGCATOB" in the A-rail circuit and AGCBRAIL is fixed at "AGCBTOA" in the B-rail circuit. Thus, determination signal Y is set to "1" so as to instruct selection of the B-rail circuit in order to adjust the gain of the AGC amplifier (B).

(A, B, C)=(0, 1, 1) indicates that AGCARAIL≦AGCATOB and AGCBRAIL> (AGCBTOA−X) (i.e. AGCBRAIL≧AGCBTOA) are established, and that determination signal Y urging selection of the B-rail circuit had been output in the immediately preceding cycle. This indicates a state where AGCARAIL is fixed at "AGCATOB" in the A-rail circuit and AGCBRAIL is not past "AGCBTOA" in the B-rail circuit. Thus, determination signal Y is set to "1" so as to instruct selection of the B-rail circuit in order to adjust the gain of AGC amplifier (B) 130.

(A, B, C)=(0, 0, 1) indicates that AGCARAIL≦AGCATOB and AGCBRAIL> (AGCBTOA−X) (i.e. AGCBRAIL≧AGCBTOA) are established, and that determination signal Y urging selection of the B-rail circuit had been output in the immediately preceding cycle. This indicates a state where AGCARAIL is fixed at "AGCATOB" in the A-rail circuit and AGCBRAIL is past "AGCBTOA" in the B-rail circuit. Thus, determination signal Y is set to "0" so as to indicate selection of the A-rail circuit in order to adjust the gain of AGC amplifier (A) 120.

Control direction decision circuit 24 receives inputs A, B and C, and outputs a rail selection signal SELOUT. Input A is determination signal Y output from control direction determination circuit 22. Input B is an output value of the D-type flip-flop, i.e. determination signal Y in the immediately preceding cycle. Input C is reset signal RST.

If rail selection signal SELOUT is "0," the A-rail circuit is selected. In the A-rail circuit, the value of output signal AGCARAIL of the loop filter is adjusted based on {(P−AGCR)×AGCGA} or {(P−(SWEEP+AGCR))×AGCGA}. In the B-rail circuit, the value of output signal AGCBRAIL of the loop filter is fixed at "AGCBTOA."

If rail selection signal SELOUT is "1," the B-rail circuit is selected. In the A-rail circuit, the value of output signal AGCARAIL of the loop filter is fixed at "AGCATOB." In the B-rail circuit, the value of output signal AGCBRAIL of the loop filter is adjusted based on {(P−AGCR)×AGCGB} or {(P−(SWEEP+AGCR))×AGCGB}.

An input/output correspondence table shown in FIG. 11 that illustrates the relation between inputs (A, B, C) and output SELOUT is now described. C="0" indicates that reset has been executed. In such a state, rail selection signal SELOUT is set to "0" so as to instruct selection of the A-rail circuit.

(A, B, C)=(0, 1, 1) indicates that determination signal Y urges selection of the A-rail circuit whereas determination signal Y in the immediately preceding cycle had urged selection of the B-rail circuit. This state indicates that it has reached the point of switching from the B-rail circuit to the A-rail circuit. However, the switching is held up until the value of determination signal Y becomes stable in order to avoid frequent switching of the A-rail circuit and the B-rail circuit occurring due to noise, which makes the entire gain unstable. Thus, the rail selection signal is set to "1" so as to instruct selection of the B-rail circuit in accordance with the determination signal in the immediately preceding cycle.

(A, B, C)=(1, 0, 1) indicates that determination signal Y urges selection of the B-rail circuit whereas determination signal Y in the immediately preceding cycle had urged selection of the A-rail circuit. This state indicates that it has reached the point of switching from the A-rail circuit to the B-rail circuit. However, the switching is held up until the value of determination signal Y becomes stable in order to avoid frequent switching between the A-rail circuit and the B-rail circuit occurring due to noise mixed, making the entire gain unstable. Thus, the rail selection signal is set to "0" so as to instruct selection of the A-rail circuit in accordance with the determination signal in the immediately preceding cycle.

(A, B, C)=(0+, 0, 1) indicates that determination signal Y urging selection of the A-rail circuit has been input continuously over at least N cycles. Such a state indicates that it has reached the point of switching from the B-rail circuit to the A-rail circuit and the value of determination signal Y is sufficiently stable. Thus, the rail selection signal is set to "0" so as to instruct selection of the A-rail circuit in accordance with determination signal Y.

(A, B, C)=(0−, 0, 1) indicates that determination signal Y urging selection of the A-rail circuit has been continuously input over X cycles (<N cycles). Such a state indicates that it has reached the point of switching from the B-rail circuit to the A-rail circuit. However, the switching is held up until determination signal Y has the same value continuously over at least N cycles in order to avoid frequent switching between the A-rail circuit and the B-rail circuit occurring due to noise mixed, making the entire gain unstable. Thus, the rail selection signal is set to "1" so as to instruct selection of the B-rail circuit in accordance with determination signal Y that was obtained X cycles before.

(A, B, C)=(1+, 1, 1) indicates that determination signal Y urging selection of the B-rail circuit has been continuously input over at least N cycles. Such a state indicates that it has reached the point of switching from the A-rail circuit to the B-rail circuit. Here, determination signal Y is sufficiently stable. Thus, the rail selection signal is set to "1" so as to instruct selection of the B-rail circuit in accordance with determination signal Y.

(A, B, C)=(1−, 1, 1) indicates that determination signal Y urging selection of the B-rail circuit has been continuously input over X cycles (<N cycles). Such a state indicates that it has reached the point of switching from the A-rail circuit to the B-rail circuit. However, the switching is held up until determination signal Y has the same value continuously over at least N cycles in order to avoid frequent switching between the A-rail circuit and the B-rail circuit occurring due to noise mixed, making the entire gain unstable. Thus, the rail selection signal is set to "0" so as to instruct selection of the A-rail circuit in accordance with determination signal Y that was obtained X cycles before.

[Gain Adjustment]

Figure 12A:
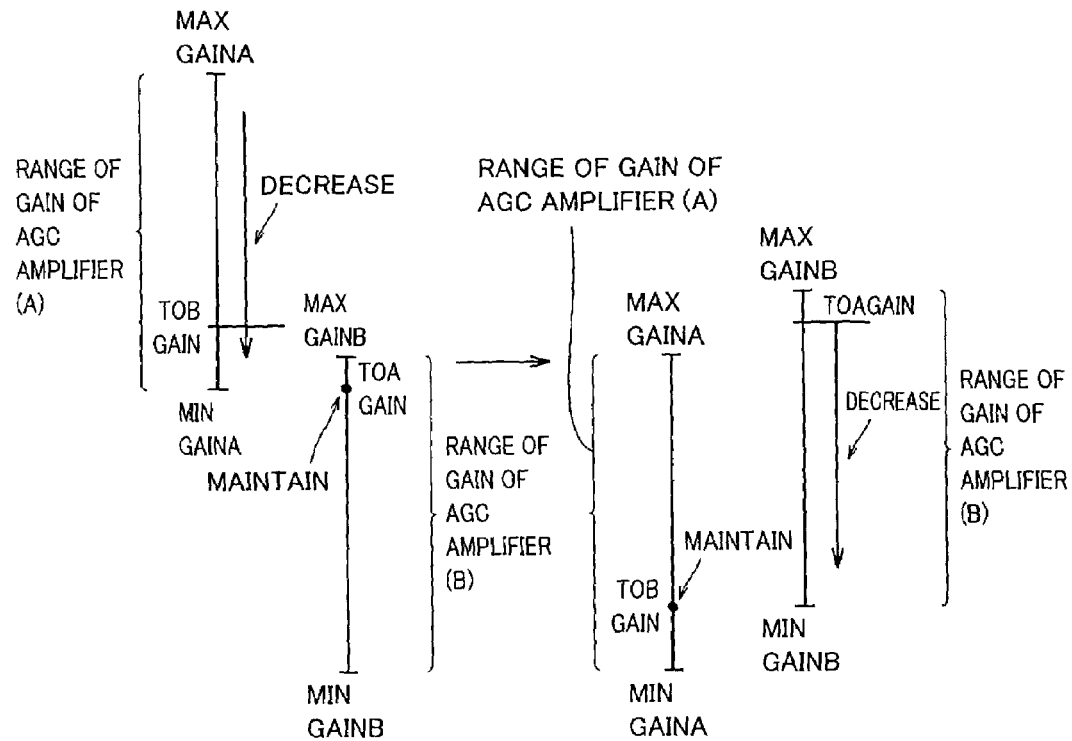
FIG. 12A illustrates the procedure of the entire gain decreasing.

The way the entire gain changes by AGC circuit 200 shown in FIG. 7 will be described. First, a procedure of the entire gain decreasing will be described with reference to FIG. 12A.

Initially, reset has been executed. In this state, output signal AGCARAIL of the loop filter is "0" in the A-rail circuit. Moreover, output signal AGCBRAIL of the loop filter is "AGCBTOA" in the B-rail circuit. Based on output signal AGCARAIL of the loop filter, the gain of AGC amplifier (A) 120 of "MAXGAINA" is obtained. Based on output signal AGCBRAIL of the loop filter, the gain of AGC amplifier (B) of "TOGAIN" is obtained. This results in the entire gain of (MAXGAINA+TOGAIN).

In this state, the A-rail circuit is selected. In the A-rail circuit, if power P of an input signal is larger than an ideal power reference value AGCR, output signal AGCARAIL of the loop filter increases. Further, in the B-rail circuit, output signal AGCBRAIL of the loop filter is fixed at "AGCBTOA." Output signal AGCARAIL of the loop filter reduces the gain of AGC amplifier (A) 120. Output signal AGCBRAIL of the loop filter maintains the gain of AGC amplifier (B) as "TOGAIN." This results in reduction of the entire gain.

If output signal AGCARAIL of the loop filter is further increased to pass "AGCATOB," the B-rail circuit is selected. In the A-rail circuit, output signal AGCARAIL of the loop filter is fixed at "AGCATOB." Further, in the B-rail circuit, if power P of the input signal is larger than ideal power reference value AGCR, output signal AGCBRAIL of the loop filter increases. Output signal AGCARAIL of the loop filter allows the gain of AGC amplifier (A) 120 to be maintained as "TOBGAIN." Output signal AGCBRAIL of the loop filter reduces the gain of AGC amplifier (B) 130. This results in reduction of the entire gain.

Figure 12B:
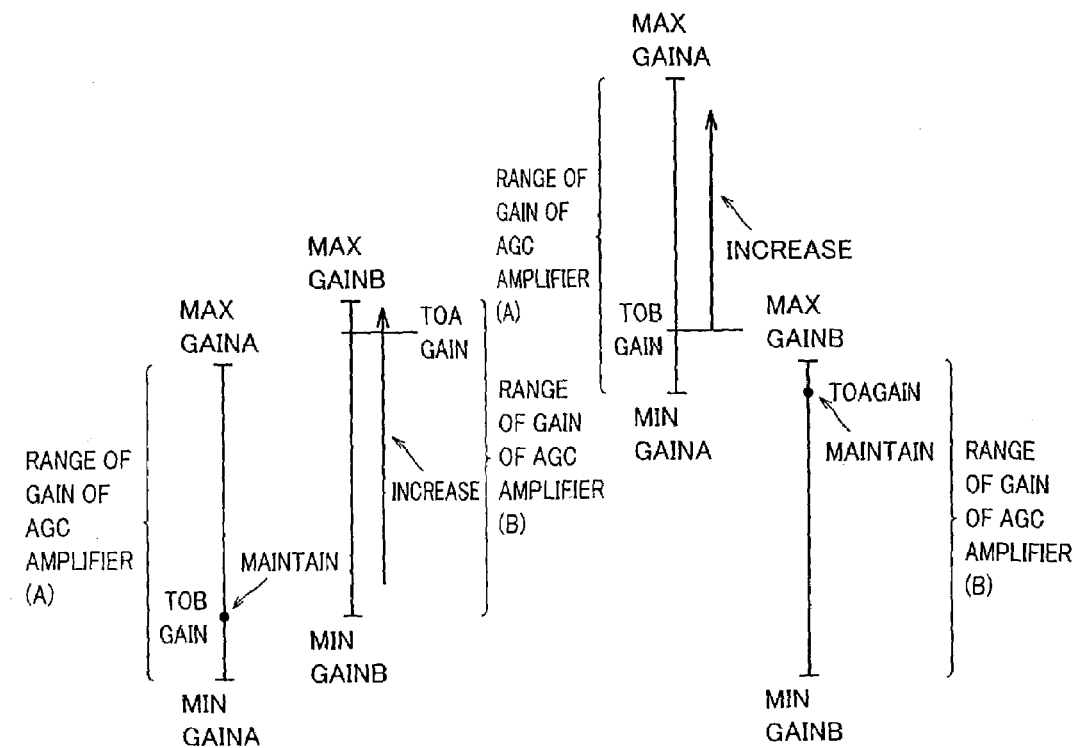
FIG. 12B illustrates the procedure of the entire gain increasing.

A procedure of the entire gain increasing will now be described with reference to FIG. 12B. Initially, the B-rail circuit is selected. In this state, output signal AGCARAIL of the loop filter is fixed at "AGCATOB" in the A-rail circuit. In the B-rail circuit, if power P of an input signal is smaller than ideal power reference value AGCR, output signal AGCBRAIL of the loop filter decreases. Output signal AGCARAIL of the loop filter allows the gain of AGC amplifier (A) 120 to be maintained as "TOBGAIN." Output signal AGCBRAIL of the loop filter increases the gain of AGC amplifier (B) 130. This results in increase of the entire gain.

If output signal AGCBRAIL of the loop filter further decreases to a value less than "AGCBTOA," the A-rail circuit is selected. In the A-rail circuit, if power P of the input signal is smaller than ideal power reference value AGCR, output signal AGCARAIL of the loop filter decreases. In the B-rail circuit, output signal AGCBRAIL of the loop filter is fixed at "AGCBTOA." Output signal AGCARAIL of the loop filter increases the gain of AGC amplifier (A) 120. Output signal AGCBRAIL of the loop filter allows the gain of AGC amplifier (B) 130 to be maintained as "TOAGAIN." This results in increase of the entire gain.

Characteristics of the gain adjustment in an AGC circuit as described above will now be described below.

(1) AGC amplifier (A) 120 and AGC amplifier (B) 130 are controlled by output signals AGCARAIL and AGCBRAIL of different loop filters (in practice, such control is performed by AGCOUTA and AGCOUTB obtained by converting the output signals of these loop filters into analog values). This allows control of AGC amplifier (A) 120 separately from AGC amplifier (B) 130.

(2) The value of output signal AGCBRAIL of the loop filter is constant when the value of output signal AGCARAIL of the loop filter varies, and output signal AGCARAIL of the loop filter is constant when the value of output signal AGCBRAIL of the loop filter varies. This prevents simultaneous change in the gains of both AGC amplifier (A) 120 and AGC amplifier (B) 130. This can prevent complicated gain control.

(3) In order to lower the gain, AGC amplifier (A) 120 is adjusted first. In order to increase the gain, AGC amplifier (B) 130 is adjusted first. Accordingly, the entire gain is allocated to AGC amplifier (B) 130 amplifying a RF signal, in preference to AGC amplifier (A) 120. Thus, even if the signal input to the receiver is very weak, the tuner can output an IF signal with a magnitude enough to perform processes in the subsequent stages.

(4) At an AGC amplifier, the relation between a control signal and a gain presents a so-called hysteresis characteristic. The value of the gain with respect to the value of the control signal obtained when the gain increases is different from that obtained when the gain decreases.

At AGC amplifier (A) 120, if the gain is lowered, the value of output signal AGCARAIL of the loop filter increases with an end point set at a value greater than "AGCATOB" and equal to or lower than "1," whereas it decreases with a start point set at a value of "AGCATOB" if the gain is increased. This indicates that the end point of output signal AGCARAIL of the loop filter at the time of reducing the gain is greater than the start point of the value of output signal AGCARAIL of the loop filter at the time of increasing the gain. By AGC amplifier (A) 120 having the hysteresis characteristic, an end gain of AGC amplifier (A) 120 at the time of lowering the gain can have a value closer to a start gain of AGC amplifier (A) 120 at the time of increasing the gain when the start point of the output signal of the loop filter (the analog-converted control signal) is different from the end point thereof compared to when these points are the same.

Likewise, at AGC amplifier (B) 130, the value of output signal AGCBRAIL of the loop filter decreases with an end point set at a value equal to or higher than "0" and lower than "AGCBTOA" if the gain is increased, whereas the value of output signal AGCBRAIL of the loop filter increases with a start point set at the value of "AGCBTOA" if the gain is reduced. That is, the end point of the value of output signal AGCBRAIL of the loop filter at the time of increasing the gain is smaller than the start point of the value of output signal AGCBRAIL of the loop filter at the time of reducing the gain. By AGC amplifier (B) 130 having the hysteresis characteristic, an end gain of AGC amplifier (B) 130 at the time of increasing the gain can have a value closer to a start gain of AGC amplifier (B) 130 at the time of reducing the gain when the start point of the output signal (i.e. control signal) of the loop filter is different from the end point thereof compared to when these points are the same.

As described above, the start gain and the end gain have approximated values when the gain of each AGC amplifier is lowered and when it is increased, allowing stable control.

[Operation]

Figure 13:
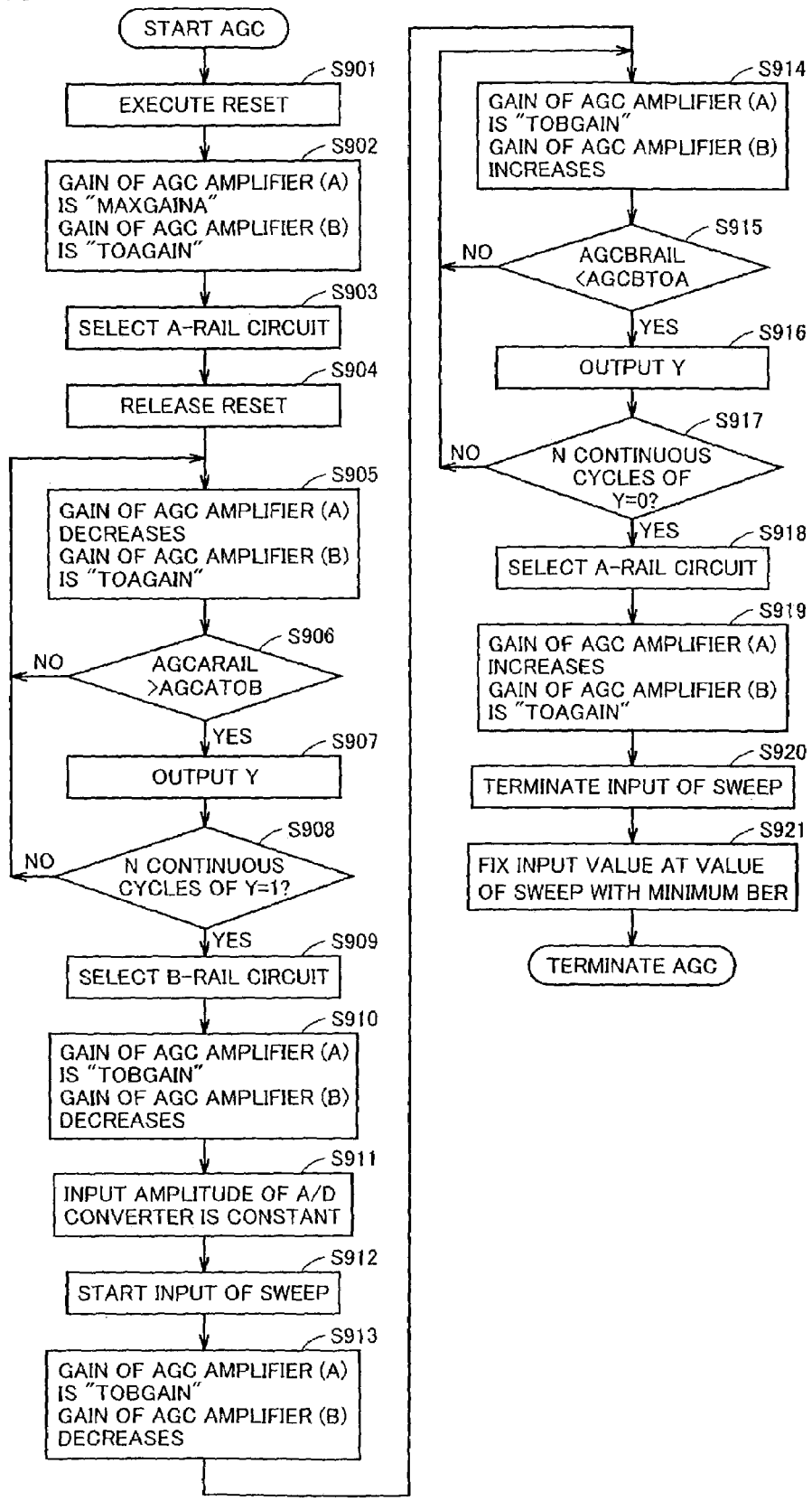
FIG. 13 shows a flow chart illustrating a processing procedure of AGC control.

The operation of AGC will be described with reference to the process procedure of AGC control shown in FIG. 13, and to AGCARAIL, AGCBRAIL, the gain of AGC amplifier (A) 120, a gain of AGC amplifier (B) 130, an input amplitude of an A/D converter, a value of sweep signal SWEEP and a change in BER with time that are shown in FIGS. 14A–14H.

First, after power input, control circuit 201 sets reset signal RST to "0" for reset execution. This sets a selection signal of selector 2 to "0." Moreover, rail selection signal SELOUT output by control direction decision circuit 24 of rail selection circuit 210 is set to "0" (step S901).

Figure 14A:
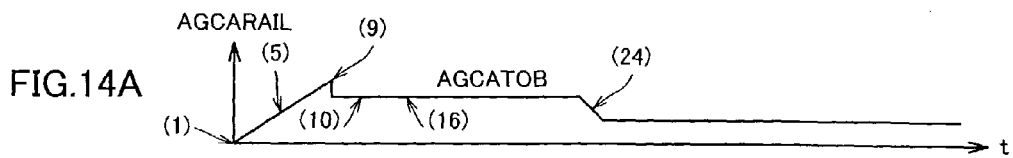
FIGS. 14A–14H illustrate AGCARAIL, AGCBRAIL, a gain of AGC amplifier (A) 120, a gain of AGC amplifier (B) 130, an input amplitude of an A/D converter, a value of sweep signal SWEEP and a change in BER with time.

In the A-rail circuit, the loop filter formed by adder 8, AND circuit 9, selector 10 and D-type flip-flop 11 outputs AGCARAIL="0" based on RST="0" and SELOUT="0" (indicated by (1) in FIG. 14A). Digital-analog converter (DAC) 17 outputs control signal AGCOUTA obtained by converting AGCARAIL="0" into an analog value, to AGC amplifier (A) 120.

Figure 14B:
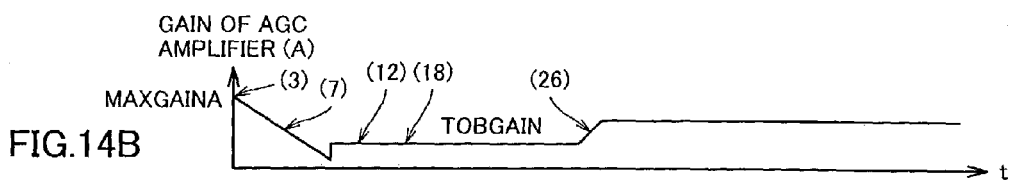
Figure 14C:
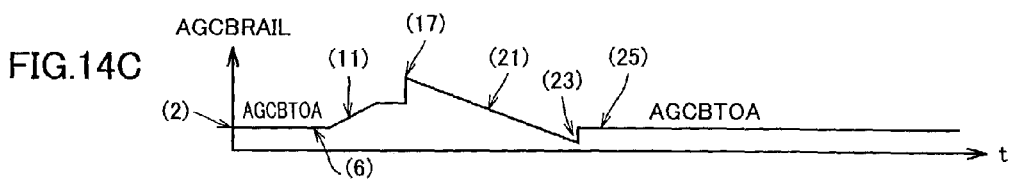

In the B-rail circuit, the loop filter formed by adder 13, selector 14 and D-type flip-flop 15 outputs AGCARAIL="AGCBTOA" in accordance with SELOUT="0" (indicated by (2) in FIG. 14C). Digital-analog converter (DAC) 18 outputs control signal AGCOUTB obtained by converting AGCBRAIL="AGCBTOA" into an analog value, to AGC amplifier (B) 130.

At AGC amplifier (A) 120, control signal AGCOUTA adjusts the gain to a value corresponding to AGCAR-AIL="0", i.e., to "MAXGAINA" (indicated by (3) in FIG. 14B). In AGC amplifier (B) 130, control signal AGCOUTB adjusts the gain to a value corresponding to AGCBRAIL="AGCBTOA", i.e., to "TOAGAIN" (indicated by (4) in FIG. 14D) (step S902).

Rail selection circuit 210 receives inputs of AGCAR-AIL="0" and AGCBRAIL="AGCBTOA."

Adder 19 calculates the value of (AGCATOB−AGCARAIL) to obtain a positive calculation result, the value of MSB of the calculation result, i.e. "0," being output to control direction determination circuit 22 as input A.

Adder 21 and adder 20 calculate (AGCBTOA−AGCBRAIL)−X to obtain a negative calculation result, the value of MSB of the calculation result, i.e. "1," being output to control direction determination circuit 22 as input B.

Further, input C of control direction determination circuit 22 is a default value of "0."

Control direction determination circuit 22 searches for a control direction corresponding to A="0," B="1" and C="0" from the input/output correspondence table shown in FIG. 10, and outputs determination signal Y="0" that urges selection of the A-rail circuit.

Control direction decision circuit 24 obtains C="0" based on reset signal RST="0," searches for an output corresponding to C="0" from an input/output correspondence table shown in FIG. 11, and outputs rail selection signal SELOUT="0" that instructs selection of the A-rail circuit (step S903).

Subsequently, control circuit 201 sets reset signal RST to "1" for reset release. However, sweep enable signal SWEEPEN is "0," so that a selection signal of selector 2 is "0" (step S904).

Adder 5 performs addition on "0" and "AGCR" to output "AGCR." Square-sum operation circuit 3 calculates a square sum of "AGCIN" (symbol information on the I-axis and the Q-axis). Square-root operation circuit 4 calculates a square root of the calculated square sum, i.e. power P of an input signal. Adder 6 performs subtraction on power "P" of the input signal and "AGCR."

At the A-rail circuit, multiplier 7 multiplies (P−AGCR) with AGCGA. Based on RST="1" and SELOUT="0," the loop filter formed by adder 8, AND circuit 9, selector 10 and D-type flip-flop 11 averages the values of {(P−AGCR)×AGCGA} for output. Here, it is assumed that the value of output signal AGCARAIL of the loop filter increases (indicated by (5) in FIG. 14A). Digital-analog converter (DAC) 17 outputs control signal AGCOUTA obtained by converting the averaged value of {(P−AGCR)×AGCGA} which is an output value of the loop filter into an analog value, to AGC amplifier (A) 120.

At the B-rail circuit, selector 14 keeps selecting "AGCBTOA" based on output signal SELOUT="0" of rail selection circuit 210. This allows AGCBRAIL="AGCBTOA" to be maintained (indicated by (6) in FIG. 14C). Digital-analog converter (DAC) 18 outputs control signal AGCOUTB obtained by converting the value of "AGCBTOA" which is an output value of the loop filter into an analog value, to AGC amplifier (B) 130.

At AGC amplifier (A) 120, control signal AGCOUTA adjusts the gain to decrease in association with increase in the value of output signal AGCARAIL of the loop filter (indicated by (7) in FIG. 14B). At AGC amplifier (B) 130, control signal AGCOUTB allows the gain to be maintained as a value corresponding to AGCBRAIL="AGCBTOA," i.e. "TOAGAIN" (indicated by (8) in FIG. 14D) (step S905).

The process at step S905 above is repeated, gradually reducing the gain of AGC amplifier (A) 120. If the value of AGCARAIL is past "AGCATOB" (indicated by (9) in FIG. 14A) (step S906), the processes below will be performed.

Adder 19 calculates a value of (AGCATOB−AGCARAIL) to obtain a negative calculation result, the value of MSB of the calculation result, i.e. "1," being output to control direction determination circuit 22 as input A.

Adder 21 and adder 20 calculate (AGCBTOA−AGCBRAIL)−X to obtain a negative calculation result, the value of MSB of the calculation result, i.e. "1," being output to control direction determination circuit 22 as input B.

Moreover, control direction determination circuit 22 had output determination signal Y="0" that urges selection of the A-rail circuit in the previous cycle, so that "0" is input as input C.

Control direction determination circuit 22 searches for a control direction corresponding to A="1," B="1" and C="0" from the input/output correspondence table shown in FIG. 10, and outputs determination signal Y="1" that urges selection of the B-rail circuit. Determination signal Y="1" is input into control direction decision circuit 24 as input A.

Further, control direction decision circuit 24 receives an input of determination signal Y="0" as input B that urges selection of the A-rail circuit in the previous cycle that is held at D-type flip-flop 23.

Control direction decision circuit 24 searches for a control direction corresponding to A="1" and B="0" from the input/output correspondence table shown in FIG. 11, and outputs rail selection signal SELOUT="0" that instructs selection of the A-rail circuit (step S907).

Steps S905 to S907 are then repeated N cycles. Control direction determination circuit 22 outputs Y="1" continuously over N cycles (step S908), and then control direction decision circuit 24 continuously receives input A="1" over N cycles. As a result, control direction decision circuit 24 changes the control direction according to the input/output correspondence table shown in FIG. 11, and outputs rail selection signal SELOUT="1" that instructs selection of the B-rail circuit (step S909).

Adder 5, square-sum operation circuit 3, square-root operation circuit 4 and adder 6 perform subtraction on power P of the input signal and AGCR.

At the A-rail circuit, selector 10 selects "AGCATOB" based on output signal SELOUT="1" of rail selection circuit 210. This sets the value of AGCARAIL to "AGCATOB" (indicated by (10) in FIG. 14A). Digital-analog converter (DAC) 17 outputs control signal AGCOUTA obtained by converting the output value of the loop filter "AGCATOB" into an analog value to AGC amplifier (A) 120.

At the B-rail circuit, selector 14 selects an output of adder 13 based on output signal SELOUT="1" of rail selection circuit 210. Thus, the value of AGCBRAIL corresponds to an averaged value of {(P−AGCR)×AGCGB}. Here, it is assumed that the value of output signal AGCBRAIL of the loop filter increases (indicated by (11) in FIG. 14C). Digital-analog converter (DAC) 18 outputs control signal AGCOUTB obtained by converting the averaged value of {(P−AGCR)×AGCGB} which is the output value of the loop filter into an analog value, to AGC amplifier (B) 130.

At AGC amplifier (A) 120, control signal AGCOUTA maintains the gain at a value corresponding to output signal AGCARAIL="AGCATOB" of the loop filter, i.e. the value of "TOBGAIN" (indicated by (12) in FIG. 14B). At AGC amplifier (B) 130, control signal AGCOUTB adjusts the gain to decrease in association with increase in the value of output signal AGCBRAIL of the loop filter (indicated by (13) in FIG. 14D).

When the gain of AGC amplifier (B) is decreasing, the B-rail circuit is always selected as will be described below.

Adder 19 calculates the value of (AGCATOB−AGCARAIL) to obtain a calculation result of "0," the value of MSB of the calculation result, i.e. "0," being output to control direction determination circuit 22 as input A.

Adder 21 and adder 20 calculate (AGCBTOA−AGCBRAIL)−X to obtain a negative calculation result, the value of MSB of the calculation result, i.e. "1," being output to control direction determination circuit 22 as input B.

In addition, control direction determination circuit 22 receives "1" as input C, since it had output determination signal Y="1" that urges selection of the B-rail circuit in the previous cycle.

Control direction determination circuit 22 searches for a control direction corresponding to A="0," B="1" and C="1" from the input/output correspondence table shown in FIG. 10, and outputs determination signal Y="1" that urges selection of the B-rail circuit. Determination signal Y="1" is input into control direction decision circuit 24 as input A.

Further, control direction decision circuit 24 receives an input of determination signal Y="1" as input B that is held at D-type flip-flop 23 and that urges selection of the A-rail circuit in the previous cycle.

Control direction decision circuit 24 searches for a control direction corresponding to A="1" (continuously over at least N cycles) and B="1," and outputs rail selection signal SELOUT="1" that instructs selection of the B-rail circuit (step S910).

Figure 14D:
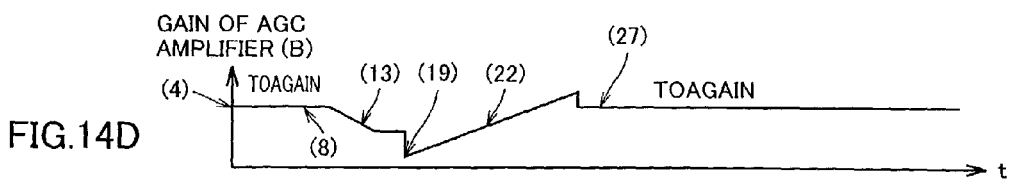
Figure 14E:
Figure 14F:
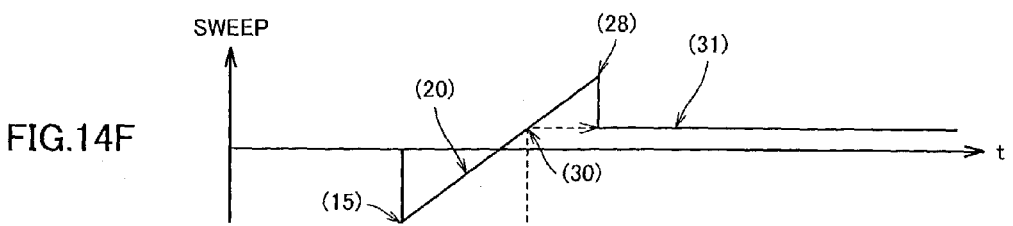
Figure 14G:
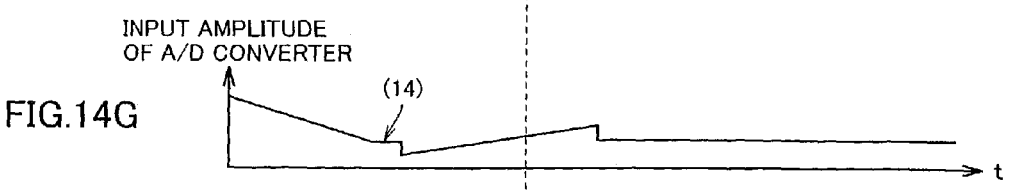

The process above is repeated, resulting that the entire gain reaches a constant value and that the input amplitude of the A/D converter reaches a constant value (indicated by (14) in FIG. 14G) (step S911).

At the time point where the input amplitude of A/D converter 105 becomes constant, error correction circuit 198 commences error correcting operation. If FEC is converged so as to attain a stage where BER can be measured, error correction circuit 198 informs BER calculation portion 121 and control circuit 201 thereof.

When reaching the stage where BER can be measured, control circuit 201 sets sweep enable signal SWEEPEN="1," and sets the value of sweep signal SWEEP to the lower limit within a determined range (indicated by (15) in FIG. 14F), which is gradually increased. A change in the value of sweep signal SWEEP causes a change in the gains of AGC amplifier (A) 120 or AGC amplifier (B) 130, thereby changing the input amplitude of A/D converter 105, causing a change in a bit error rate (BER) calculated at BER calculation portion 121. Control circuit 201 stores the set value of sweep signal SWEEP and the value of BER obtained thereby in association with each other (step S912).

A selection signal of selector 2 sets the value of sweep signal SWEEP to "SWEEP" in accordance with sweep enable signal SWEEPEN="1." Adder 5 performs addition on "SWEEP" and "AGCR," to output (SWEEP+AGCR). Adder 6 performs subtraction on power P of the input signal and (SWEEP+AGCR) to output {(P−(SWEEP+AGCR)}.

At the A-rail circuit, selector 10 selects "AGCATOB" based on output signal SELOUT="1" of rail selection circuit 210. This allows the value of AGCARAIL to be maintained as AGCATOB (indicated by (16) in FIG. 14A). Digital-analog converter (DAC) 17 outputs control signal AGCOUTA obtained by converting output value AGCATOB of the loop filter into an analog value, to AGC amplifier (A) 120.

At the B-rail circuit, multiplier 12 multiplies {P−(SWEEP+AGCR)} with AGCGB. Selector 14 then selects an output of adder 13 based on output signal SELOUT="1" of rail selection circuit 210. Accordingly, output signal AGCBRAIL of the loop filter assumes an averaged value of {P−(SWEEP+AGCR)}. Here, it is assumed that the value of output signal AGCBRAIL of the loop filter increases, since SWEEP is a negative value. Digital-analog converter (DAC) 18 outputs control signal AGCOUTB obtained by converting the averaged value of {P−(SWEEP+AGCR)}×AGCGB which is the output value of the loop filter into an analog value, to AGC amplifier (B) 130.

At AGC amplifier (A) 120, control signal AGCOUTA allows the gain to be maintained as a value corresponding to output signal AGCARAIL="AGCATOB" of the loop filter, i.e. "TOBGAIN" (indicated by (18) in FIG. 14B). At AGC amplifier (B) 130, control signal AGCOUTB adjusts the gain to decrease in association with increase in the value of output signal AGCBRAIL of the loop filter (indicated by (19) in FIG. 14D) (step S913).

As the value of sweep signal "SWEEP" increases (indicated by (20) in FIG. 14F), the value of AGCBRAIL decreases (indicated by (21) in FIG. 14C), the gain of AGC amplifier (B) 130 being adjusted to increase (indicated by (22) in FIG. 14D) (step S914). If the value of AGCBRAIL becomes lower past "AGCBTOA" (indicated by (23) in FIG. 14C) (step S915), the process below will be performed.

Adder 19 calculates the value of (AGCATOB−AGCARAIL) to obtain a positive calculation result, the value of MSB of the calculation result, i.e. "0," being output to control direction determination circuit 22 as input A.

Adder 21 and adder 20 calculate (AGCBTOA−AGCARAIL)−X to obtain 0 or a positive calculation result, the value of MSB of the calculation result, i.e. "0," being output to control direction determination circuit 22 as input B.

Moreover, control direction determination circuit 22 receives an input of "1" as input C, since it had output determination signal Y="1" urging selection of the B-rail circuit in the previous cycle.

Control direction determination circuit 22 searches for a control direction corresponding to A="0," B="0" and C="1" from the input/output correspondence table shown in FIG. 10, and outputs determination signal Y="0" urging selection of the A-rail circuit. Determination signal Y="0" is input into control direction decision circuit 24 as input A.

Moreover, control direction decision circuit 24 receives an input of determination signal Y="1" as input B that is held in D-type flip-flop 23 and that urged selection of the B-rail circuit in the previous cycle.

Control direction decision circuit 24 searches for a control direction corresponding to A="0" and B="1" from the input/output correspondence table shown in FIG. 1, and outputs SELOUT="1" (step S916).

Steps S914 to S916 are then repeated N cycles. When control direction determination circuit 22 outputs Y="0" continuously over N cycles (step S917), control direction decision circuit 24 receives input A="0" continuously over N cycles. As a result, control direction decision circuit 24 changes the control direction according to the input/output correspondence table shown in FIG. 11, and outputs rail selection signal SELOUT="0" that instructs selection of the A-rail circuit (step S918).

At the A-rail circuit, multiplier 7 multiplies {P−(SWEEP+AGCR)} with AGCGA. Based on RST="1" and SELOUT="0," the loop filter formed by adder 8, AND circuit 9, selector 10 and D-type flip-flop 11 averages the values of {P−(SWEEP+AGCR)}×AGCGA for output. Here, it is assumed that the value of output signal AGCARAIL of the loop filter decreases (indicated by (24) in FIG. 14A). Digital-analog converter (DAC) 17 outputs control signal AGCOUTA obtained by converting the averaged value of {P−(SWEEP+AGCR)}×AGCGA which is the output value of the loop filter into an analog value, to AGC amplifier (A) 120.

At the B-rail circuit, selector 14 maintains selection of "AGCBTOA" based on output signal SELOUT="1" of rail selection circuit 210. Thus, AGCBRAIL="AGCBTOA" is maintained (indicated by (25) in FIG. 14C). Digital-analog converter (DAC) 18 outputs control signal AGCOUTB obtained by converting a value of "AGCBTOA" which is the output value of the loop filter into an analog value, to AGC amplifier (B) 130.

At AGC amplifier (A) 120, control signal AGCOUTA adjusts the gain to increase in association with decrease in the value of output signal AGCARAIL of the loop filter (indicated by (26) in FIG. 14B). At AGC amplifier (B) 130, control signal AGCOUTB allows the gain to be maintained as a value corresponding to output signal AGCBRAIL="AGCBTOA" of the loop filter, i.e. the value of "TOAGAIN" (indicated by (27) in FIG. 14D) (step S919).

Figure 14H:
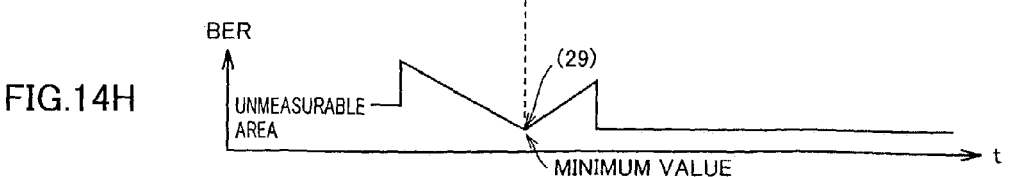

If the value of sweep signal "SWEEP" reaches the upper limit within a determined range (indicated by (28) in FIG. 14F) (step S920), control circuit 201 searches for the smallest value in the stored BER (indicated by (29) in FIG. 14H), and identifies the value of SWEEP corresponding to that BER (indicated by (30) in FIG. 14F). Control circuit 201 fixes the identified value of sweep signal SWEEP as a value of sweep signal SWEEP that is to be input into AGC circuit 200 (indicated by (31) in FIG. 14F) (step S921).

As described above, the AGC circuit according to the present embodiment includes the A-rail circuit controlling the gain of AGC amplifier (A) 120 and the B-rail circuit controlling the gain of AGC amplifier (B) 130, allowing separate control of the AGC amplifiers.

[Modification]

The present invention is not limited to the embodiment above, but naturally includes, for example, the modification below.

(1) AGC Circuit

Figure 15:
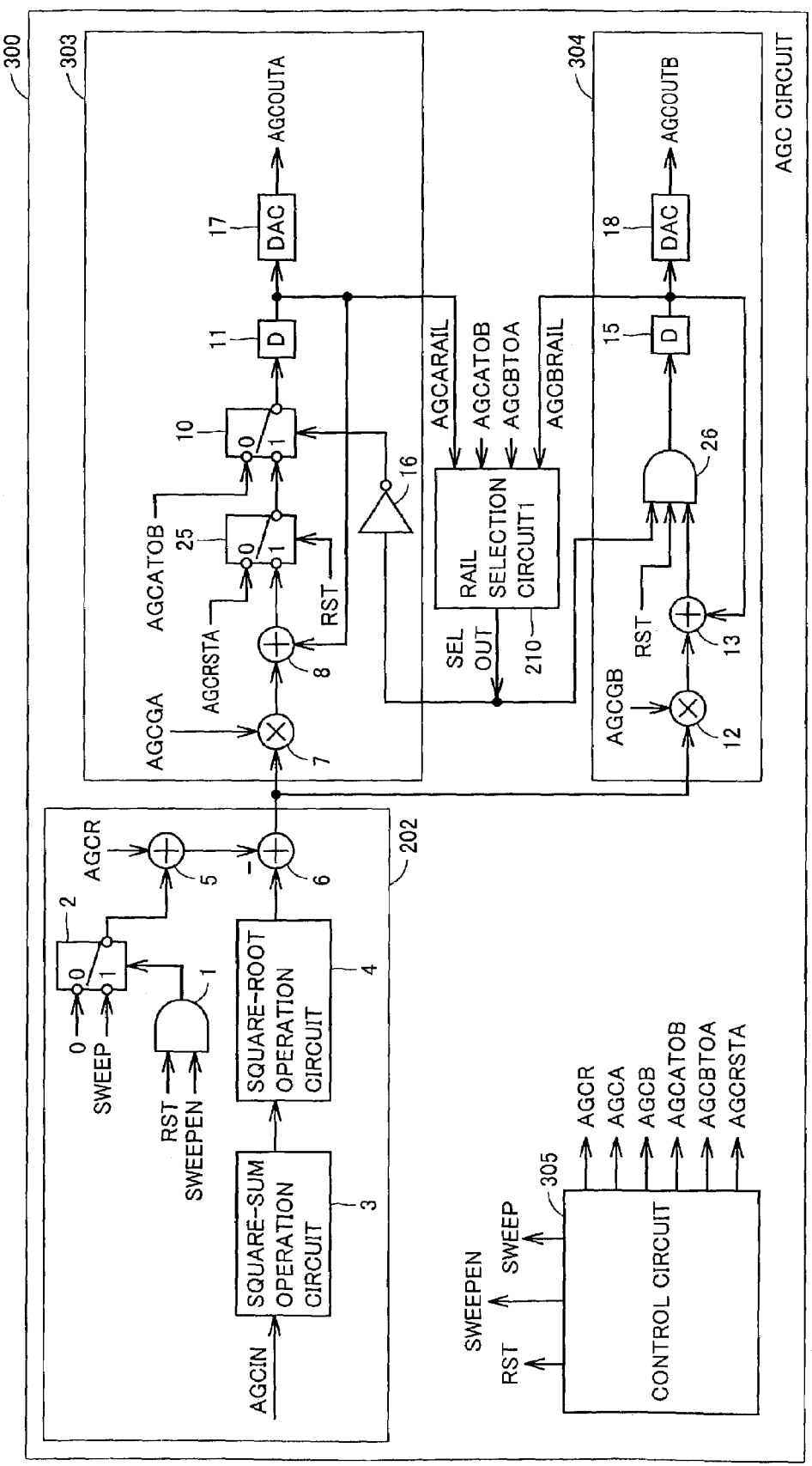
FIG. 15 shows a modification of an AGC circuit.

An AGC circuit 300 shown in FIG. 15 is different from AGC circuit 200 shown in FIG. 7 in terms of an A-rail circuit 303, a B-rail circuit 304 and a control circuit 305.

Control circuit 305 is approximately the same as control circuit 201 shown in FIG. 7, except that control circuit 305 further performs setting of AGCRSTA based on an entry by the user for setting. AGCRSAT is a value related to the gain of AGC amplifier (A) 120 when reset is executed as will be described later, and is determined by the user in accordance with use conditions.

A-rail circuit 303 includes a selector 25 in place of AND circuit 9 included in A-rail circuit 203 shown in FIG. 7. Selector 25 outputs "AGCRSTA" if reset signal RST="0" and reset is executed. Thus, when reset is executed, the value of output signal AGCARAIL of the loop filter is "AGCRSTA."

Accordingly, when reset is executed, the gain of AGC amplifier (A) 120 can be set to a value corresponding to output signal AGCARAIL="AGCRSTA" of the loop filter, not the maximum value "MAXGAINA" as in AGC circuit 200 shown in FIG. 7.

B-rail circuit 304 includes an AND circuit 26 in place of selector 14 included in B-rail circuit 204 shown in FIG. 7. AND circuit 26 outputs "0" if reset signal RST="0" and reset is executed. Moreover, AND circuit 26 outputs "0" if rail selection signal SELOUT="0" and the A-rail circuit is selected. Thus, if reset is executed or if the A-rail circuit is selected, output signal AGCBRAIL of the loop filter has a value "0."

Accordingly, when reset is executed or when the A-rail circuit is selected, the gain of AGC amplifier (B) can be set to a value corresponding to output signal AGCBRAIL="0" of the loop filter, i.e. the maximum value "MAXGAINB," not "TOAGAIN" as in AGC circuit 200 shown in FIG. 7.

(2) BER

In the present embodiment, adjustment was performed by the input of sweep signal SWEEP in order to lower bit error rate BER as in the first embodiment. If bit error rate BER is not a particular concern, however, there is no need to input sweep signal SWEEP for adjustment, so that circuits involving the input of sweep signal SWEEP and processes thereby may be dispensed with. Same can be applied to the following embodiments.

(3) Relation Between AGC Amplifier and Control Signal

While the present embodiment described that control signal AGCOUTA generated at the A-rail circuit controls AGC amplifier (A) 120 whereas control signal AGCOUTB generated at the B-rail circuit controls AGC amplifier (B) 130, it is not limited thereto.

It may also be possible that control signal AGCOUTA controls AGC amplifier (B) 130 and control signal AGCOUTB controls AGC amplifier (A) 120. Same can be applied to the following embodiments.

Third Embodiment

Figure 16:
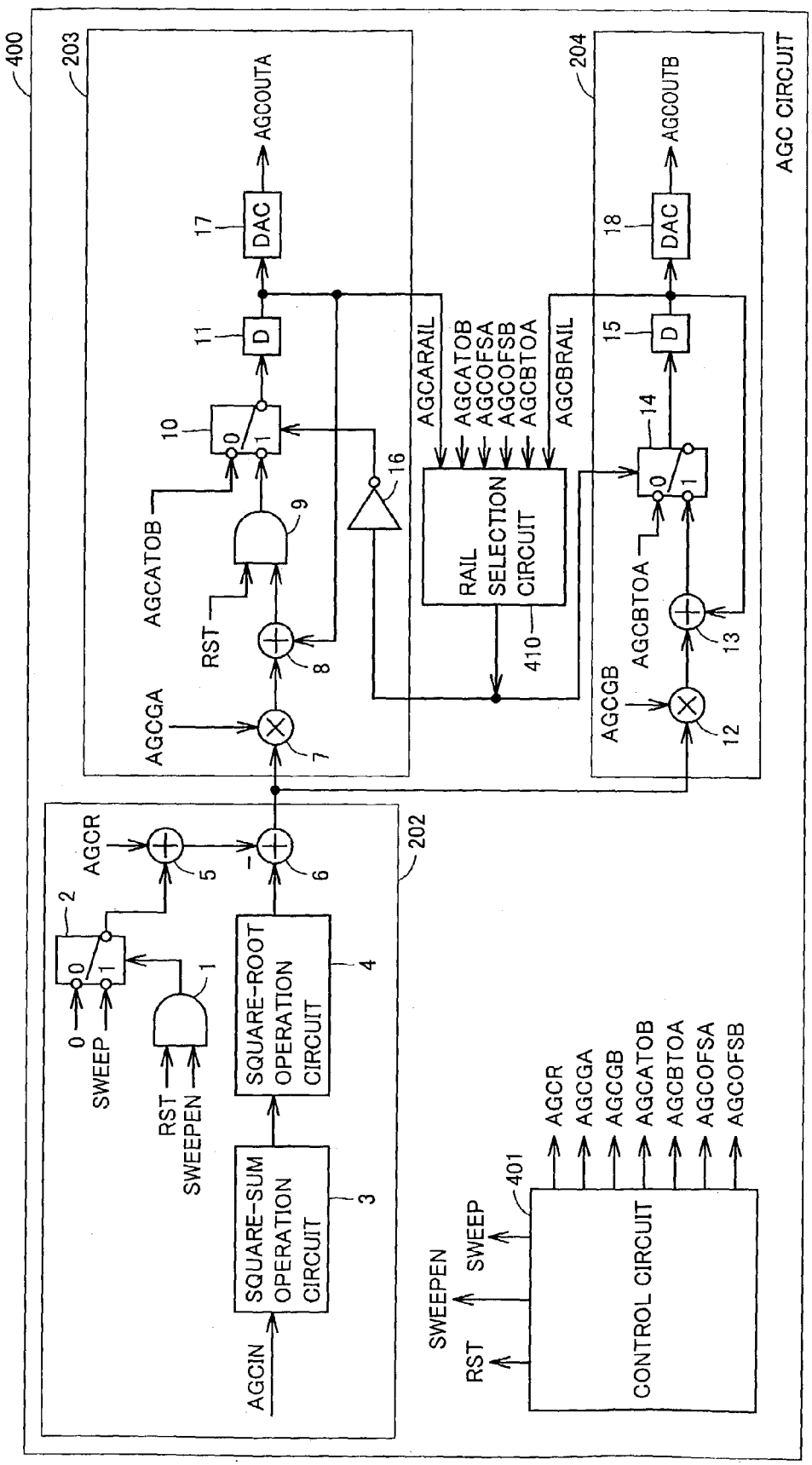
FIG. 16 shows the configuration of an AGC circuit.

The present embodiment relates to an AGC circuit provided with an offset at rail switching. A receiver in the present embodiment shows the same configuration as that in the second embodiment shown in FIG. 6. An AGC circuit 400 according to the present embodiment shown in FIG. 16 is different from the AGC circuit according to the second embodiment shown in FIG. 7 in terms of a rail selection circuit and a control circuit.

A control circuit 401 is approximately the same as control circuit 201 shown in FIG. 7, except that control circuit 401 further performs setting of AGCOFSA and AGCOFSB based on an entry by the user for setting. AGCOFSA is an offset between the value of AGCARAIL that is fixed when selection is switched to the B-rail circuit and a threshold value (AGCATOB) that determines whether or not selection should be switched to the B-rail circuit. Moreover, AGCOFSB is an offset between the value of AGCBRAIL that is fixed when selection is switched to the A-rail circuit and a threshold value (AGCBTOA) that determines whether or not selection should be switched to the A-rail circuit.

Figure 17A:
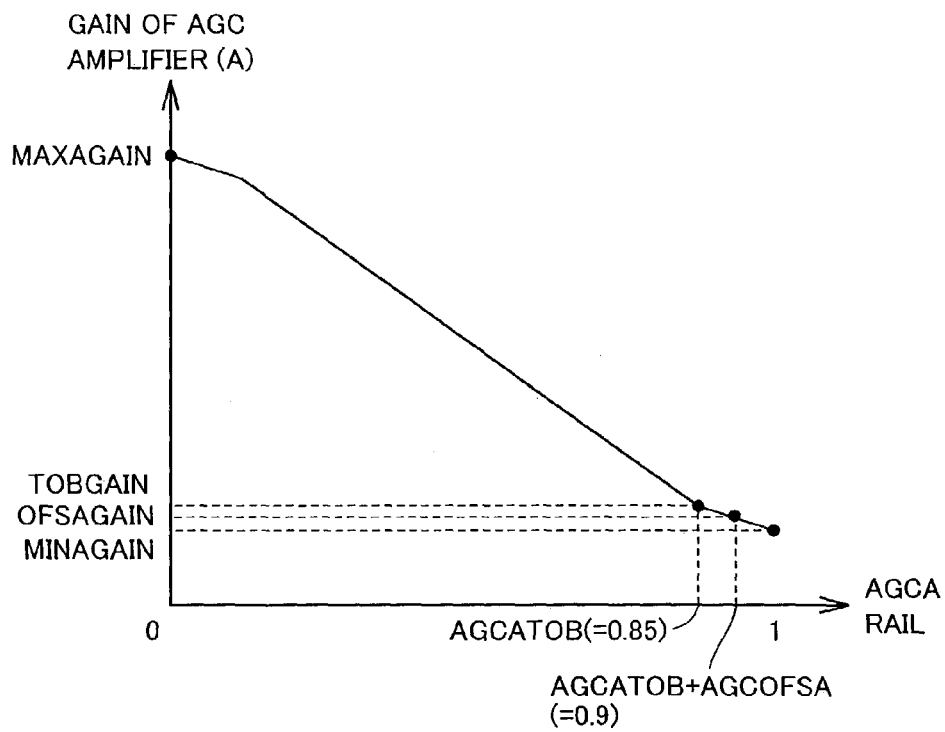
FIG. 17A shows the relation between output signal AGCARAIL of a loop filter and a gain of AGC amplifier (A) 120.

As can be seen from FIG. 17A, the gain of AGC amplifier (A) 120 is a maximum value of "MAXGAINA" if output signal AGCARAIL of the loop filter is a minimum value of "0," whereas the gain of AGC amplifier (A) 120 is a minimum value of "MINGAINA" if output signal AGCARAIL of the loop filter is a maximum value of "1." Moreover, the gain of AGC amplifier (A) 120 is "TOBGAIN" if output signal AGCARAIL of the loop filter is "AGCATOB," whereas it is "OFSAGAIN" if output signal AGCARAIL of the loop filter is "AGCATOB+AGCOFSA." It is assumed that each of "TOBGAIN" and "OFSAGAIN" is a value close to "MINAGAINA" and having gain characteristics such as a low degree of distortion and less tendency to have noise (i.e. stable gain characteristics).

Figure 17B:
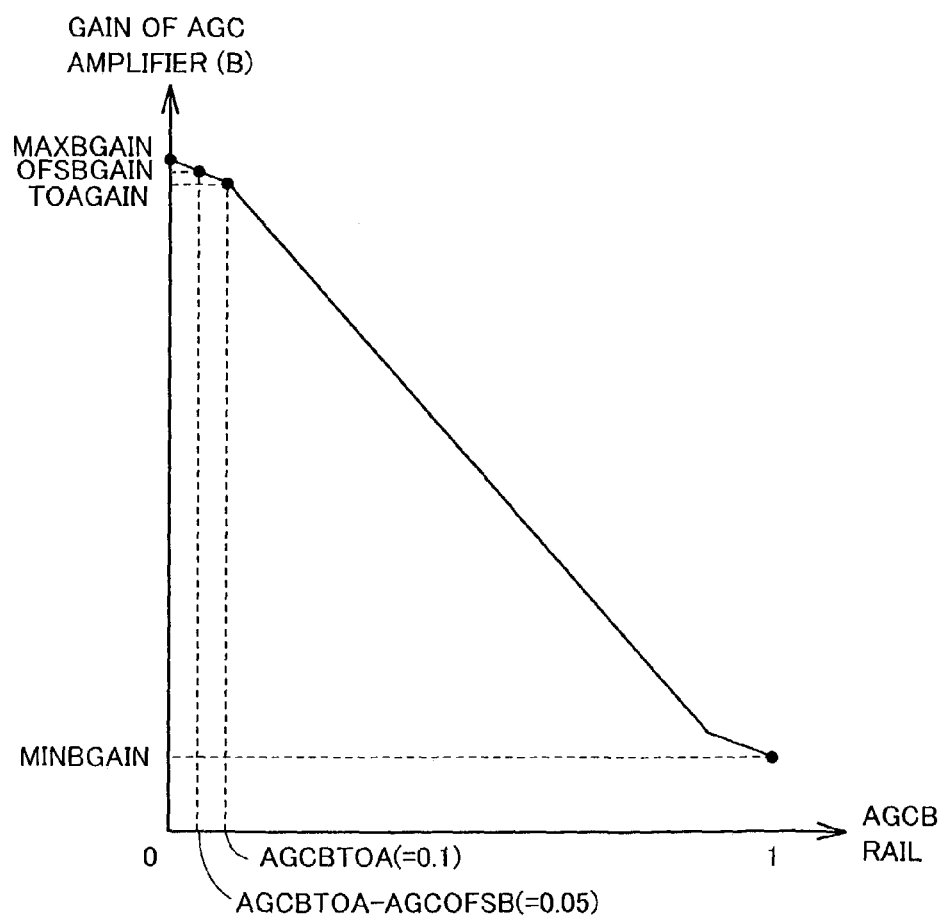
FIG. 17B shows the relation between output signal AGCBRAIL of a loop filter and a gain of AGC amplifier (B) 130.

As can be seen from FIG. 17B, the gain of AGC amplifier (B) 130 is a maximum value of "MAXGAINB" if output signal AGCBRAIL of the loop filter is a minimum value of "0," whereas the gain of AGC amplifier (B) 130 is a minimum value of "MINGAINB" if output signal AGCBRAIL of the loop filter is a maximum value of "1." Moreover, the gain of AGC amplifier (B) 130 is "TOAGAIN" if output signal AGCBRAIL of the loop filter is "AGCBTOA," whereas it is "OFSBGAIN" if output signal AGCBRAIL of the loop filter is "AGCBTOA−AGCOFSB." It is assumed that each of "TOAGAIN" and "OFSBGAIN" is a value close to "MAXGAINB" and having gain characteristics such as a low degree of distortion and less tendency to have noise (i.e. stable gain characteristics).

Figure 18:
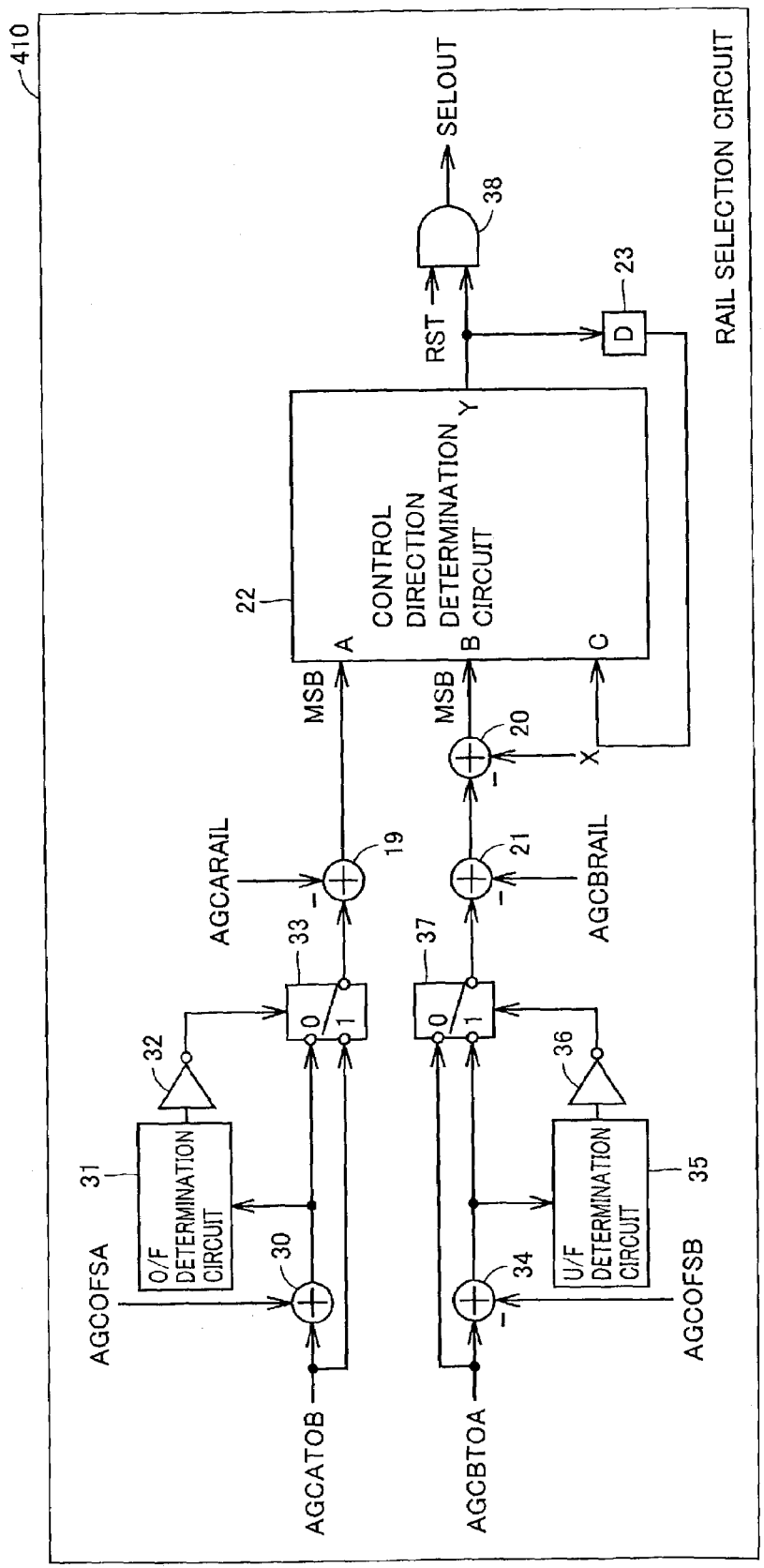
FIG. 18 shows the configuration of a rail selection circuit.

A rail selection circuit 410 according to the present embodiment shown in FIG. 18 includes an adder 30, an O/F determination circuit 31, an inverter 32, a selector 33, an adder 34, a U/F determination circuit 35, an inverter 36, a selector 37, an adder 19, an adder 20, an adder 21, a control direction determination circuit 22, a D-type flip-flop 23 and an AND circuit 38.

Adder 30 performs addition on "AGCATOB" and "AGCOFSA" to output (AGCATOB+ATCOFSA). If (AGCATOB+AGCOFSA)>1 is established, O/F determination circuit 31 determines that overflow occurs, and outputs "1." Inverter 32 inverts the output of O/F determination circuit 31. Selector 33 outputs "AGCATOB" if an output of inverter 32 is "0," i.e., if overflow occurs, and outputs (AGCATOB+AGCOFSA) if the output of inverter 32 is "1," i.e., if no overflow occurs.

Adder 34 performs subtraction on "AGCBTOA" and "AGCOFSB" to output (AGCBTOA−AGCOFSB). If (AGCBTOA−AGCOFSB)<0 is established, U/F determination circuit 35 determines that underflow occurs, and outputs "1." Inverter 36 inverts the output of U/F determination circuit 35. Selector 37 outputs "AGCBTOA" if an output of inverter 36 is "0," i.e., if underflow occurs, and outputs (AGCBTOA−AGCOFSB) if the output of inverter 36 is "1," i.e., if no underflow occurs.

Adder 19 performs subtraction on (AGCATOB+AGCOFSA) and output signal AGCARAIL of the loop filter in the A-rail circuit, to output (AGCATOB+AGCOFSA−AGCARAIL).

Adder 21 performs subtraction on (AGCBTOA−AGCOFSB) and output signal AGCBRAIL of the loop filter in the B-rail circuit, to output (AGCBTOA−AGCOFSB−AGCBRAIL).

Adder 20 performs subtraction on (AGCBTOA−AGCOFSB−AGCBRAIL) and X to output (AGCBTOA−AGCOFSB−AGCBRAIL−X). The value of X corresponds to a value with only the least significant bit (hereinafter referred to as LSB) is 1, i.e. the lowest positive value. Adder 20 is provided to output a negative value when AGCBRAIL=AGCBTOA−AGCOFSB is established.

Adders 19, 20 and 21 perform operation in the two's complement form. Thus, the most significant bit (hereinafter referred to as MSB) has a value "0" if the operation result is 0 or a positive value, and the bit value of MSB is "1" if the operation result is a negative value.

Control direction determination circuit 22 receives inputs A, B and C, and outputs determination signal Y. Input A is MSB of an output of adder 20. Input B is MSB of an output of adder 21. Input C is an output of the D-type flip-flop, i.e. determination signal Y in the immediately preceding cycle.

Determination signal Y of "0" urges AND circuit 38 to select the A-rail circuit. Determination signal Y of "1" urges AND circuit 38 to select the B-rail circuit. The relation between inputs (A, B, C) and output Y follows the input/output correspondence table shown in FIG. 10, as in the second embodiment.

If reset signal RST="0" and reset is executed, AND circuit 38 outputs rail selection signal SELOUT="0." If reset signal RST="1" and the reset is released, AND circuit 38 outputs rail selection signal SELOUT=Y. That is, determination signal Y output by control direction determination circuit 22 is output as it is.

[Gain Adjustment]

Figure 19A:
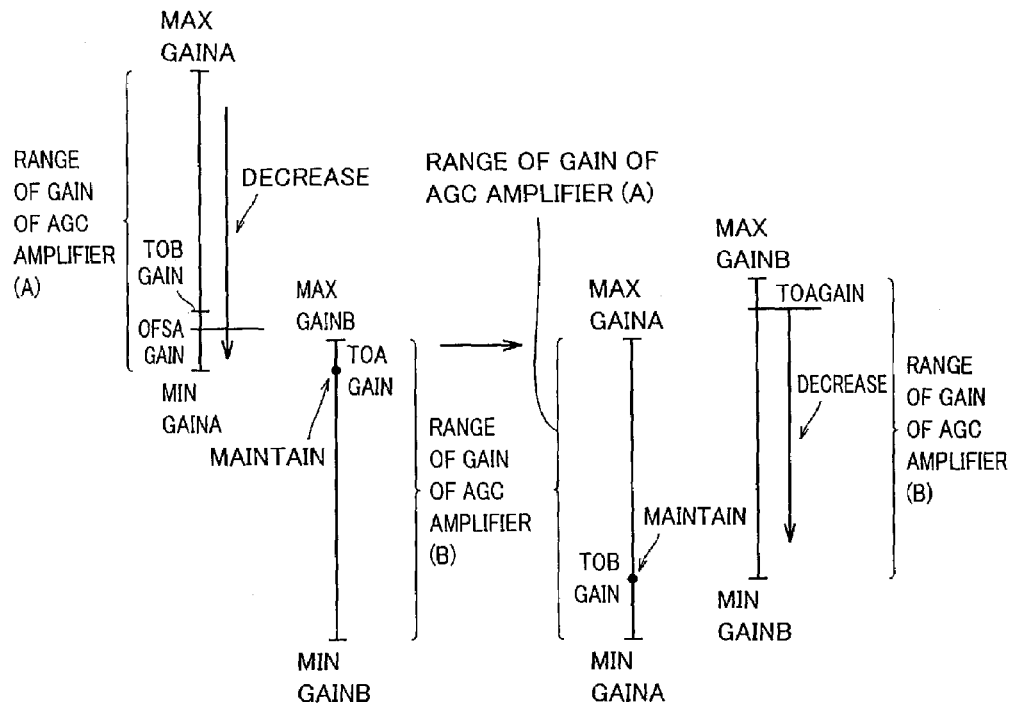
FIG. 19A shows a procedure of the entire gain decreasing.

How the entire gain changes by AGC circuit 400 shown in FIG. 16 is now described. First, a procedure of the entire gain decreasing will be described with reference to FIG. 19A.

Initially, reset has been executed. In this state, output signal AGCARAIL of the loop filter is "0" in the A-rail circuit. Further, output signal AGCBRAIL="AGCBTOA" is obtained in the B-rail circuit. Based on output signal AGCARAIL of the loop filter, the gain of AGC amplifier (A) 120 is "MAXGAINA." Based on output signal AGCBRAIL of the loop filter, the gain of AGC amplifier (B) 130 is "TOGAIN." As a result, the entire gain of (MAXGAINA+TOGAIN) is obtained.

In this state, the A-rail circuit is selected. In the A-rail circuit, if power P of the input signal is larger than ideal power reference value AGCR, output signal AGCARAIL of the loop filter increases. Further, in the B-rail circuit, output signal AGCBRAIL of the loop filter is fixed at "AGCBTOA." Output signal AGCARAIL of the loop filter reduces the gain of AGC amplifier (A) 120. Output signal AGCBRAIL of the loop filter allows the gain of AGC amplifier (B) 130 to maintain as "TOGAIN." As a result, the entire gain is reduced.

If output signal AGCARAIL of the loop filter is further increased to pass "AGCATOB+AGCOFSA," the B-rail circuit is selected. In the A-rail circuit, output signal AGCARAIL of the loop filter is fixed at "AGCATOB." Further, at the B-rail circuit, if power P of the input signal is larger than ideal power reference value AGCR, output signal AGCBRAIL of the loop filter increases. Output signal AGCARAIL of the loop filter allows the gain of AGC amplifier (A) 120 to maintain as "TOBGAIN." Output signal AGCBRAIL of the loop filter reduces the gain of AGC amplifier (B) 130. As a result, the entire gain is reduced.

Figure 19B:
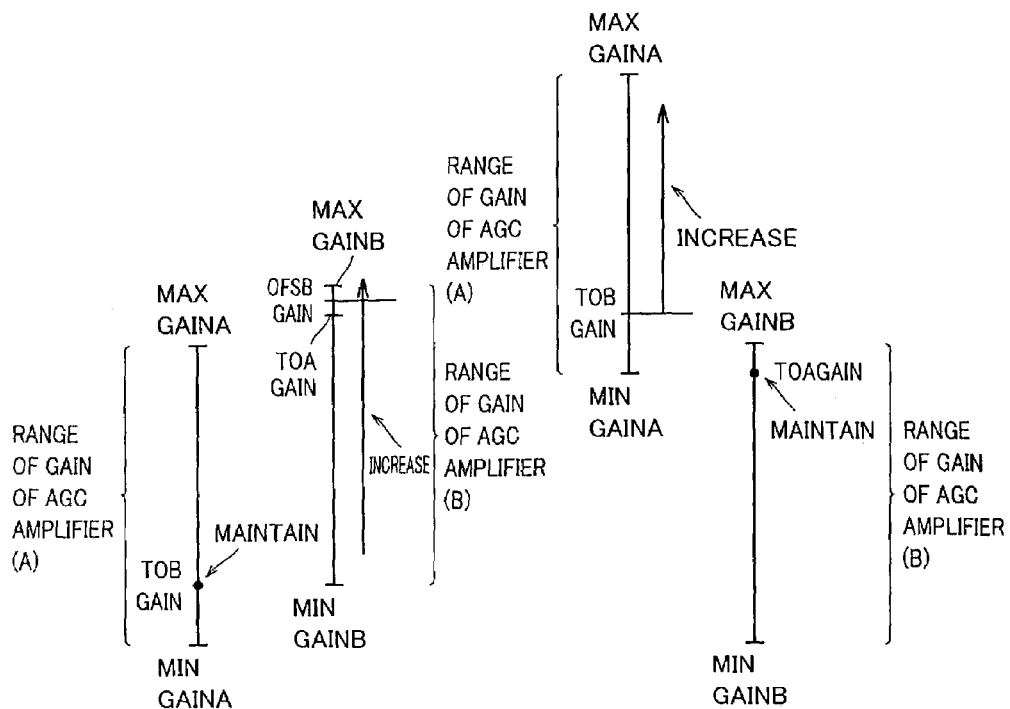
FIG. 19B shows a procedure of the entire gain increasing.

Subsequently, a procedure of the entire gain increasing is described with reference to FIG. 19B. Initially, the B-rail circuit is selected. In this state, output signal AGCARAIL of the loop filter is fixed at "AGCATOB" in the A-rail circuit. In the B-rail circuit, if power P of the input signal is smaller than ideal power reference value AGCR, output signal AGCBRAIL of the loop filter decreases. Output signal AGCARAIL of the loop filter allows the gain of AGC amplifier (A) 120 to maintain as "TOBGAIN." Output signal AGCBRAIL of the loop filter increases the gain of AGC amplifier (B) 130. As a result, the entire gain is increased.

If output signal AGCBRAIL of the loop filter is further reduced to a value lower than "AGCBTOA−AGCOFSB," the A-rail circuit is selected. In the A-rail circuit, if power P of the input signal is lower than ideal power reference value AGCR, output signal AGCARAIL of the loop filter decreases. In the B-rail circuit, output signal AGCBRAIL of the loop filter is fixed at "AGCBTOA." Output signal AGCARAIL of the loop filter increases the gain of AGC amplifier (A) 120. Output signal AGCBRAIL of the loop filter allows the gain of AGC amplifier (B) 130 to be maintained as "TOAGAIN." As a result, the entire gain is increased.

The gain adjustment for the AGC circuit as described above further has the characteristics below in addition to (1)–(4) described in the second embodiment.

(5) When selection is switched from the B-rail circuit to the A-rail circuit, the value of output signal AGCARAIL of the loop filter is "AGCATOB." Here, when the value of output signal AGCARAIL of the loop filter slightly varies, the value may be set so as not to pass "AGCATOB+AGCOFSA" even though it is past "AGCATOB." This can prevent the problem such that the selection is switched back from the A-rail circuit to the B-rail circuit, allowing stable switching.

Likewise, when selection is switched from the A-rail circuit to the B-rail circuit, the value of output signal AGCBRAIL of the loop filter is "AGCBTOA." Here, when the value of output signal AGCBRAIL of the loop filter slightly varies, the value may be set so as not to be lower than "AGCBTOA−AGCOFSB" even though it becomes lower than "AGCBTOA." This can prevent the problem such that the selection is switched back from the B-rail circuit to the A-rail circuit, allowing stable switching.

[Operation]

Figure 20:
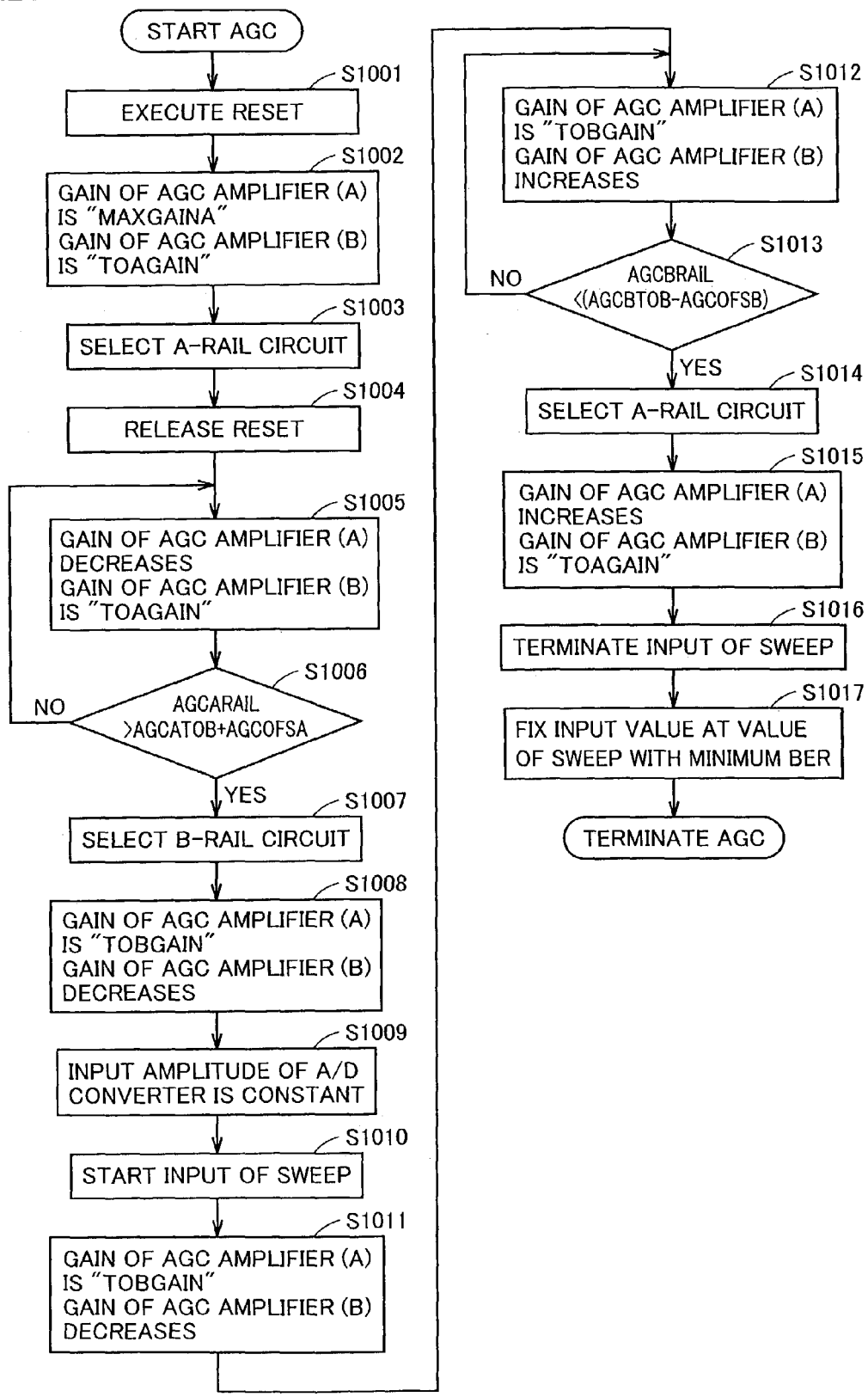
FIG. 20 shows a flow chart illustrating a process procedure of AGC control.

The operation of AGC is described with reference to the process procedure of AGC control shown in FIG. 20, and AGCARAIL, AGCBRAIL, a gain of AGC amplifier (A) 120, a gain of AGC amplifier (B), an input amplitude of the A/D converter, a value of sweep signal SWEEP and a change in BER with time that are shown in FIGS. 21A–21H.

First, after power input, control circuit 401 sets reset signal RST to "0" and reset is executed. This sets the selection signal of selector 2 to "0." Further, based on reset signal RST="0," rail selection signal SELOUT output by rail selection circuit 410 is set to "0" (step S1001).

At the A-rail circuit, the loop filter formed by adder 8, AND circuit 9, selector 10, and D-type flip-flop 11 outputs AGCARAIL="0" based on RST="0" and SELOUT="0" (indicated by (1) in FIG. 21A). Digital-analog converter (DAC) 17 outputs control signal AGCOUTA obtained by converting AGCARAIL="0" into an analog value, to AGC amplifier (A) 120.

At the B-rail circuit, the loop filter formed by adder 13, selector 14 and D-type flip-flop 15 outputs AGCARAIL="AGCBTOA" based on SELOUT="0" (indicated by (2) in FIG. 21C). Digital-analog converter (DAC) 18 outputs control signal AGCOUTB obtained by converting AGCBRAIL="AGCBTOA" into an analog value, to AGC amplifier (B) 130.

At AGC amplifier (A) 120, control signal AGCOUTA adjusts the gain to be a value corresponding to AGCARAIL="0," i.e. "MAXGAINA" (indicated by (3) in FIG. 21B). At AGC amplifier (B) 130, control signal AGCOUTB adjusts the gain to be a value corresponding to AGCBRAIL="AGCBTOA," i.e. "TOAGAIN" (indicated by (4) in FIG. 21D) (step S1002).

Rail selection circuit 210 receives inputs of AGCARAIL="0" and AGCBRAIL="AGCBTOA."

Adder 19 calculates the value of (AGCATOB+AGCOFSA−AGCARAIL) to obtain a positive calculation result, the value of MSB of the calculation result, i.e. "0," being output to control direction determination circuit 22 as input A.

Adder 21 and adder 20 calculate (AGCBTOA−AGCOFSB−AGCBRAIL)−X to obtain a negative calculation result, the value of MSB of the calculation result, i.e. "1," being output to control direction determination circuit 22 as input B. Further, input C of control direction determination circuit 22 is a default value of "0."

Control direction determination circuit 22 searches for a control direction corresponding to A="0," B="1" and C="0" from the input/output correspondence table shown in FIG. 10, and outputs determination signal Y="0" that urges selection of the A-rail circuit.

AND circuit 38 outputs rail selection signal SELOUT="0" that instructs selection of the A-rail circuit based on reset signal RST="0" and determination signal Y="0" (step S1003).

Subsequently, control circuit 401 sets reset signal RST to "1" to release the reset. However, sweep enable signal SWEEPEN="0" is established, so that the selection signal of selector 2 is "0" (step S1004).

Adder 5 performs addition on "0" and "AGCR" to output "AGCR." Square-sum operation circuit 3 calculates a square sum of "AGCIN" (symbol information on the I-axis and the Q-axis). Square-root operation circuit 4 calculates a square root of the calculated square sum, i.e. power P of the input signal. Adder 6 performs subtraction on power "P" of the input signal and "AGCR."

At the A-rail circuit, multiplier 7 multiplies (P−AGCR) with AGCGA. Based on RST="1" and SELOUT="0," the loop filter formed by adder 8, AND circuit 9, selector 10 and D-type flip-flop 11 averages the values of {(P−AGCR)×AGCGA} for output. Here, it is assumed that the value of output signal AGCARAIL of the loop filter increases (indicated by (5) in FIG. 21A). Digital-analog converter (DAC) 17 outputs control signal AGCOUTA obtained by converting the averaged value of {(P−AGCR)×AGCGA} which is an output value of the loop filter into an analog value, to AGC amplifier (A) 120.

At the B-rail circuit, output signal SELOUT="0" of rail selection circuit 410 allows selector 14 to maintain selection of "AGCBTOA." Thus, AGCBRAIL="AGCBTOA" is maintained (indicated by (6) in FIG. 21C). Digital-analog converter (DAC) 18 outputs control signal AGCOUTB obtained by converting the value of "AGCBTOA" which is an output value of the loop filter into an analog value, to AGC amplifier (B) 130.

At AGC amplifier (A) 120, control signal AGCOUTA adjusts the gain to decrease in association with increase in the value of output signal AGCARAIL of the loop filter (indicated by (7) in FIG. 21B). At AGC amplifier (B) 130, control signal AGCOUTB allows the gain to be maintained as a value corresponding to AGCBRAIL="AGCBTOA," i.e. "TOAGAIN" (indicated by (8) in FIG. 21D) (step S1005).

The process at step S1005 described above is repeated to gradually reduce the gain of AGC amplifier (A) 120. If the value of AGCARAIL is past "AGCATOB+AGCOFSA" (indicated by (9) in FIG. 21A) (step S1006), the process below will be performed.

Adder 19 calculates the value of (AGCATOB+AGCOFSA−AGCARAIL) to obtain a negative calculation result, the value of MSB of the calculation result, i.e. "1," being output to control direction determination circuit 22 as input A.

Adder 21 and adder 20 calculate (AGCBTOA−AGCOFSB−AGCBRAIL)−X, to obtain a negative calculation result, the value of MSB of the calculation result, i.e. "1," being output to control direction determination circuit 22 as input B.

Further, control direction determination circuit 22 receives "0" as input C, since it had output determination signal Y="0" urging selection of the A-rail circuit in the previous cycle.

Control direction determination circuit 22 searches for a control direction corresponding to A="1," B="1" and C="0" from the input/output correspondence table shown in FIG. 10, and outputs determination signal Y="1" that urges selection of the B-rail circuit.

AND circuit 38 outputs rail selection signal SELOUT="1" that instructs selection of the B-rail circuit based on determination signal Y="1" and reset signal RST="1" (step S1007).

Adder 5, square-sum operation circuit 3, square-root operation circuit 4 and adder 6 perform subtraction on power P of the input signal and AGCR.

At the A-rail circuit, selector 10 selects "AGCATOB" based on output signal SELOUT="1" of rail selection circuit 410. Thus, the value of AGCARAIL assumes "AGCATOB" (indicated by (10) in FIG. 21A). Digital-analog converter (DAC) 17 outputs control signal AGCOUTA obtained by converting output value "AGCATOB" of the loop filter into an analog value, to AGC amplifier (A) 120.

At the B-rail circuit, selector 14 selects an output of adder 13 based on output signal SELOUT="1" of rail selection circuit 410. Thus, the value of AGCBRAIL is an averaged value of {(P–AGCR)×AGCGB}. Here, it is assumed that the value of output signal AGCBRAIL of the loop filter increases (indicated by (11) in FIG. 21C). Digital-analog converter (DAC) 18 outputs control signal AGCOUTB obtained by converting the averaged value of {(P–AGCR) ×AGCGB} which is an output value of the loop filter into an analog value, to AGC amplifier (B) 130.

At AGC amplifier (A) 120, control signal AGCOUTA allows the gain to be maintained as a value corresponding to output signal AGCARAIL="AGCATOB" of the loop filter, i.e. the value of "TOBGAIN" (indicated by (12) in FIG. 21B). At AGC amplifier (B) 130, control signal AGCOUTB adjusts the gain to decrease in association with increase in output signal AGCBRAIL of the loop filter (indicated by (13) in FIG. 21D).

When the gain of AGC amplifier (B) 130 is decreasing, the B-rail circuit is always selected as will be described below.

Adder 19 calculates the value of (AGCATOB+AGCOFSA–AGCARAIL) to obtain a positive calculation result, and outputs the value of MSB of the calculation result, i.e. "0," to control direction determination circuit 22 as input A.

Adder 21 and adder 20 calculate (AGCBTOA–AGCOFSB–AGCBRAIL)–X to obtain a negative calculation result, and outputs the value of MSB of the calculation result, i.e. "1," to control direction determination circuit 22 as input B.

Moreover, control direction determination circuit 22 receives "1" as input C, since it had output determination signal Y="1" urging selection of the B-rail circuit in the previous cycle.

Control direction determination circuit 22 searches for a control direction corresponding to A="0," B="1" and C="1" from the input/output correspondence table shown in FIG. 10, and outputs determination signal Y="1" urging selection of the B-rail circuit.

AND circuit 38 outputs rail selection signal SELOUT="1" instructing selection of the B-rail circuit based on determination signal Y="1" and reset signal RST="1" (step S1008).

The process described above is repeated, resulting that the entire gain reaches a constant value and the input amplitude of the A/D converter reaches a constant value (indicated by (14) in FIG. 21G) (step S1009).

At the time point where the input amplitude of A/D converter 105 becomes constant, error correction circuit 198 commences error correcting operation. When FEC is converged so as to reach a stage where BER can be measured, error correction circuit 198 informs BER calculation portion 121 and control circuit 401 thereof.

When reaching the stage where BER can be measured, control circuit 401 sets sweep enable signal SWEEPEN to "1," and sets the value of sweep signal SWEEP to the lower limit within a determined range (indicated by (15) in FIG. 21F), which is gradually increased. As the value of sweep signal SWEEP changes, the gain of AGC amplifier (A) 120 or AGC amplifier (B) 130 changes, thereby changing the input amplitude of A/D converter 105, causing a change in the bit error rate (BER) calculated at BER calculation portion 121. Control circuit 401 stores the set value of sweep signal SWEEP and the value of BER obtained thereby in association with each other (Step S1010).

Sweep enable signal SWEEPEN="1" sets the selection signal of selector 2 to the value of sweep signal SWEEP "SWEEP." Adder 5 performs addition on "SWEEP" and "AGCR" to output (SWEEP+AGCR). Adder 6 performs subtraction on power P of the input signal and (SWEEP+AGCR) to output {P–(SWEEP+AGCR)}.

At the A-rail circuit, selector 10 selects "AGCATOB" in accordance with output signal SELOUT="1" of rail selection circuit 210. This allows the value of AGCARAIL to be maintained as AGCATOB (indicated by (16) in FIG. 21A). Digital-analog converter (DAC) 17 outputs control signal AGCOUTA obtained by converting output value "AGCATOB" of the loop filter into an analog value, to AGC amplifier (A) 120.

At the B-rail circuit, multiplier 12 multiplies {P–(SWEEP+AGCR)} with AGCGB. Selector 14 then selects an output of adder 13 based on output signal SELOUT="1" of rail selection circuit 210. Thus, the value of output signal AGCBRAIL of the loop filter is an averaged value of {P–(SWEEP+AGCR)}×AGCGB. Here, it is assumed that the value of output signal AGCBRAIL of the loop filter increases, since SWEEP is an negative value. Digital-analog converter (DAC) 18 outputs control signal AGCOUTB obtained by converting the averaged value of {P–(SWEEP+AGCR)}×AGCGB which is an output value of the loop filter into an analog value, to AGC amplifier (B) 130.

At AGC amplifier (A) 120, control signal AGCOUTA allows the gain to be maintained as a value corresponding to output signal AGCARAIL="AGCATOB" of the loop filter, i.e. "TOBGAIN" (indicated by (18) in FIG. 21B). At AGC amplifier (B) 130, control signal AGCOUTB adjusts the gain to decrease in association with increase in the value of output signal AGCBRAIL of the loop filter (indicated by (19) in FIG. 21D) (step S1011).

As the value of sweep signal "SWEEP" increases (indicated by (20) in FIG. 21F), the value of AGCBRAIL decreases (indicated by (21) in FIG. 21C), adjusting the gain of AGC amplifier (B) 130 to increase (indicated by (22) in FIG. 21D) (step S1012). If the value of AGCBRAIL is then lowered past "AGCBTOA−AGCOFSB" (indicated by (23) in FIG. 21C) (step S1013), the process below will be performed.

Adder 19 calculates the value of (AGCATOB+AGCOFSA−AGCARAIL) to obtain a positive calculation result, and outputs the value of MSB of the calculation result, i.e. "0," to control direction determination circuit 22 as input A.

Adder 21 and adder 20 calculate (AGCBTOA−AGCOFSB−AGCBRAIL)−X to obtain 0 or a positive calculation result, and outputs the value of MSB of the calculation result, i.e. "0," to control direction determination circuit 22 as input B.

Further, control direction determination circuit 22 receives "1" as input C, since it had output determination signal Y="1" urging selection of the B-rail circuit in the previous cycle.

Control direction determination circuit 22 searches for a control direction corresponding to A="0," B="0" and C="1" from the input/output correspondence table shown in FIG. 10, and outputs determination signal Y="0" that urges selection of the A-rail circuit.

AND circuit 38 outputs rail selection signal SELOUT="0" that instructs selection of the A-rail circuit based on determination signal Y="0" and reset signal RST="1" (step S1014).

At the A-rail circuit, multiplier 7 multiplies {P−(SWEEP+AGCR)} with AGCGA. Based on RST="1" and SELOUT="0," the loop filter formed by adder 8, AND circuit 9, selector 10 and D-type flip-flop 11 averages the values of {P−(SWEEP+AGCR)}×AGCGA for output. Here, it is assumed that the value of output signal AGCARAIL of the loop filter decreases (indicated by (24) in FIG. 21A). Digital-analog converter (DAC) 17 outputs control signal AGCOUTA obtained by converting the averaged value of {P−(SWEEP+AGCR)}×AGCGA which is an output value of the loop filter into an analog value, to AGC amplifier (A) 120.

At the B-rail circuit, output signal SELOUT="1" of rail selection circuit 410 allows selector 14 to maintain selection of "AGCBTOA." Thus, AGCBRAIL="AGCBTOA" is maintained (indicated by (25) in FIG. 21C). Digital-analog converter (DAC) 18 outputs control signal AGCOUTB obtained by converting the value of "AGCBTOA" which is an output value of the loop filter into an analog value, to AGC amplifier (B) 130.

At AGC amplifier (A) 120, control signal AGCOUTA adjusts the gain to increase in association with reduction in the value of output signal AGCARAIL of the loop filter (indicated by (26) in FIG. 21B). At AGC amplifier (B) 130, control signal AGCOUTB allows the gain to be maintained as a value corresponding to output signal AGCBRAIL="AGCBTOA" of the loop filter, i.e. the value of "TOAGAIN" (indicated by (27) in FIG. 21D) (step S1015).

If the value of sweep signal "SWEEP" reaches the upper limit within the determined range (indicated by (28) in FIG. 21F) (step S1016), control circuit 401 searches for the smallest value in the stored BER (indicated by (29) in FIG. 21H), and identifies a value of SWEEP corresponding to that BER (indicated by (30) in FIG. 21F). Control circuit 401 fixes the identified value of sweep signal SWEEP as a value of sweep signal SWEEP that is to be input into AGC circuit 110 (indicated by (31) in FIG. 21F) (step S1017).

As described above, the AGC circuit according to the present embodiment can control each AGC amplifier separately as in the AGC circuit according to the second embodiment. Moreover, a value displaced by an offset from the value of the output signal of the loop filter fixed when selection is switched to another rail circuit is set as a threshold value that determines whether or not selection should be switched to another rail circuit, allowing stable switching of rail circuits.

[Modification]

The present invention is not limited to the embodiment above, but naturally includes a modification, for example, as described below.

(1) Rail Selection Circuit

Figure 22:
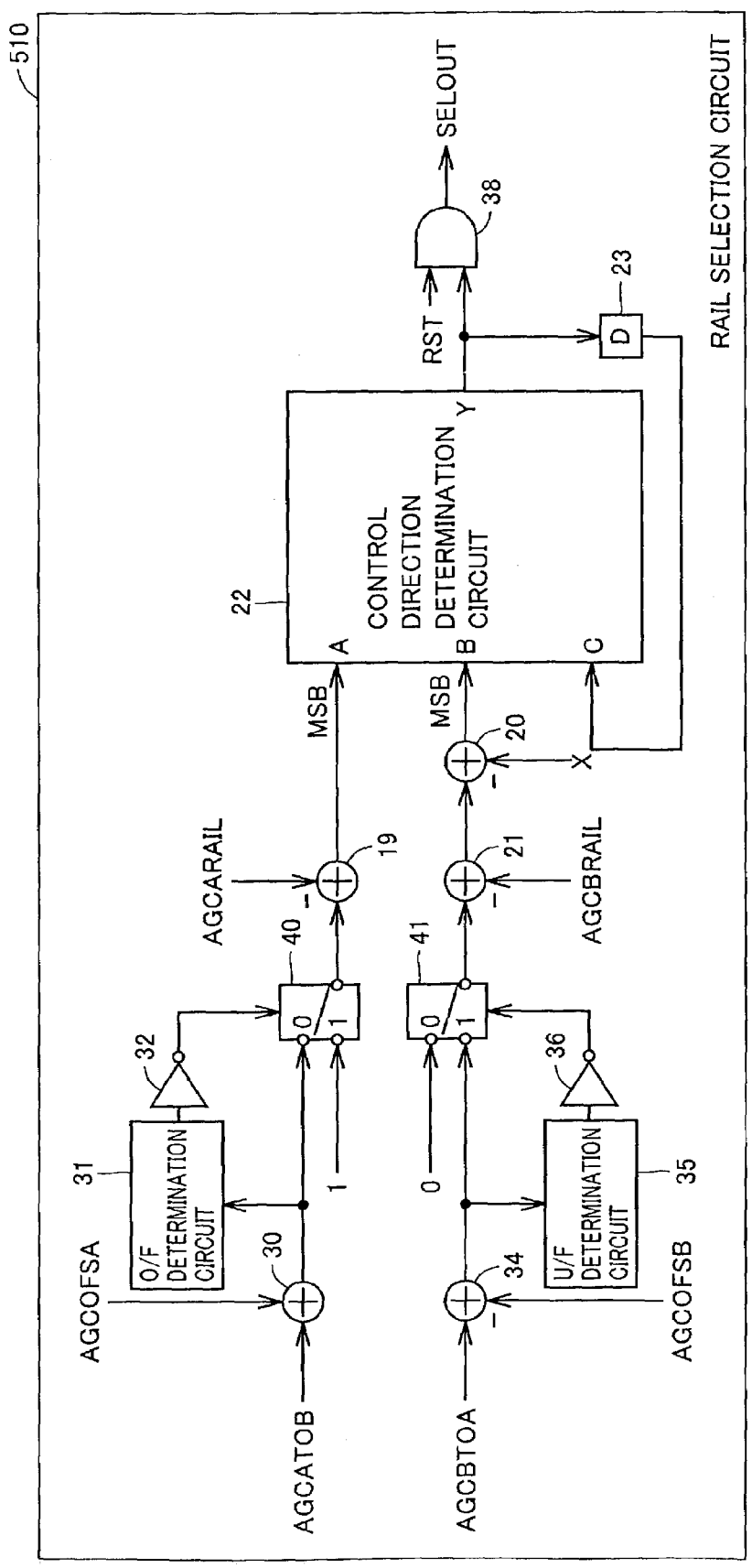
FIG. 22 shows a modification of a rail selection circuit.

A rail selection circuit 510 shown in FIG. 22 is different from rail selection circuit 410 shown in FIG. 18 in terms of a selector. In rail selection circuit 510 shown in FIG. 22, a selector 40 outputs a maximum value of "1" if it is determined that (AGCATOB+AGCOFSA)>1 at O/F determination circuit 31. Moreover, selector 41 outputs a minimum value of "0" if it is determined that (AGCBTOA−AGCOFSB)<0 at U/F determination circuit 31.

(2) AGC Circuit

While the A-rail circuit and the B-rail circuit included in the AGC circuit in the present embodiment are similar to those in the second embodiment shown in FIG. 7, these circuits can be similar to those in the modification of the second embodiment shown in FIG. 15. That is, A-rail circuit 203 and B-rail circuit 204 shown in FIG. 16 may be replaced by A-rail circuit 303 and B-rail circuit 304 shown in FIG. 15.

(3) Offset

While the present embodiment described that an offset was provided for both switching from the A-rail circuit to the B-rail circuit and switching from the B-rail circuit to the A-rail circuit, the offset may be provided for only one of the switching.

(4) D-Type Flip-Flop

While the present embodiment described that, in rail selection circuit 410, rail selection signal SELOUT was output from AND circuit 38, rail selection signal SELOUT may also be output from a D-type flip-flop provided at a subsequent stage of AND circuit 38. This allows switching of the value of rail selection signal SELOUT to require a certain period of time after switching of output value of Y from control direction determination circuit 22, thereby preventing frequent switching in both directions due to noise or the like, allowing stable switching.

(5) OFSAGAIN, OFSBGAIN

OFSAGAIN was set at a value close to MINGAINA and having stable gain characteristics in the present embodiment. If, however, preference is given to a larger difference between OFSAGAIN and TOBGAIN and to the value of TOBGAIN being as close to MINGAIN as possible, the value of OFSAGAIN may be a value closer to MINGAINA having more or less unstable gain characteristics.

Likewise, while OFSBGAIN close to MAXGAINA and having stable gain characteristics was employed, the value of OFSBGAIN may be a value closer to MAXGAINA having more or less unstable gain characteristics, if preference is given to a larger difference between OFSBGAIN and TOAGAIN and to the value of TOAGAIN being as close to MAXGAINA as possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An automatic gain control circuit controlling a gain of a receiver including a first a first automatic gain control amplifier amplifying a RF signal and a second automatic gain control amplifier amplifying an IF signal, comprising:
   an operation circuit performing addition on a value of an adjustment signal variably adjustable in a prescribed range and a reference value of a power of an input signal input into the receiver, to calculate a difference value between a result of the addition and the power of the input signal input into the receiver;
   a control signal adjustment circuit adjusting a value of a control signal controlling a gain of said first automatic gain control amplifier and a gain of said second automatic gain control amplifier, based on said difference value; and
   a control circuit, including
   a circuit to variably adjust a value of said adjustment signal,
   a circuit to acquire a bit error rate after demodulation of the input signal input into the receiver,
   a circuit to store the value of said adjustment signal and a bit error rate changed as a result of control of the gains of said first automatic gain control amplifier and said second automatic gain control amplifier by the value of the adjustment signal in association with each other, and
   a circuit to identify a value of the adjustment signal with a minimum bit error rate in said values stored in association with each other, and fixing the value of the adjustment signal input into said operation circuit to said identified value.

2. The automatic gain control circuit according to claim 1, wherein
   said control signal adjustment circuit is to adjust a value of a first control signal controlling the gain of said first automatic gain control amplifier and to control a value of a second control signal controlling the gain of said second automatic gain control amplifier, and
   said control signal adjustment circuit fixes one of the values of said first control signal and said second control signal while adjusting the other value.

3. An automatic gain control circuit controlling a gain of a receiver including a first automatic gain control amplifier amplifying a RF signal and a second automatic gain control amplifier amplifying an IF signal, comprising:
   a control signal adjustment circuit adjusting a value of a first control signal controlling a gain of either one of a first automatic gain control amplifier and a second automatic gain control amplifier and a value of a second control signal controlling a gain of the other one of said first and second automatic gain control amplifiers; and
   an adjustment instruction circuit instructing adjustment of the value of said second control signal if the value of said first control signal is past a first control value as a result of said control signal adjustment circuit adjusting the value of said first control signal such that a gain of an automatic gain control amplifier controlled by said first control signal decreases, and instructing adjustment of the value of said first control signal if the value of said second control signal is past a second control value as a result of said control signal adjustment circuit adjusting said second control signal such that a gain of an automatic gain control amplifier controlled by said second control signal increases,
   said control signal adjustment circuit fixing the value of said first control signal at said first control value while adjusting the value of said second control signal if an instruction is given to adjust the value of said second control signal, and fixing the value of said second control signal to said second control value while adjusting the value of said first control signal if an instruction is given to adjust the value of said first control signal.

4. The automatic gain control circuit according to claim 3, wherein
   said first control value is set such that a gain of an automatic gain control amplifier controlled by said first control signal is close to a minimum gain and that a gain characteristic is stable, and
   said second control value is set such that a gain of an automatic gain control amplifier controlled by said second control signal is close to a maximum gain and that a gain characteristic is stable.

5. The automatic gain control circuit according to claim 4, wherein said control signal adjustment circuit controls the gain of said first automatic gain control amplifier by the first control signal, and controlling the gain of said second automatic gain control amplifier by the second control signal.

6. The automatic gain control circuit according to claim 5, wherein said control signal adjustment circuit sets a value of said first control signal such that the gain of said first automatic gain control amplifier is close to a maximum value and that a gain characteristic is stable if an instruction for reset is given by a reset signal.

7. The automatic gain control circuit according to claim 6, wherein said adjustment instruction circuit gives an instruction to adjust a value of said first control signal if an instruction for reset is given by the reset signal.

8. The automatic gain control circuit according to claim 7, wherein
   when the gain of said first automatic gain control amplifier decreases as said first control signal controlled by said control signal adjustment circuit increases, and the gain of said second automatic gain control amplifier decreases as said second control signal controlled by said control signal adjustment circuit increases,
   said adjustment control circuit includes
   an instruction signal generation circuit generating an instruction signal instructing said control signal adjustment circuit to adjust one of the value of said first control signal and the value of said second control signal,
   a first operation circuit subtracting the value of said first control signal from said first control value,
   a second operation circuit subtracting the value of said second control signal from said second control value, and
   a D-type flip-flop latching said instruction signal;
   said instruction signal generation circuit generates an instruction signal instructing adjustment of said first control signal if an operation result of said first operation circuit is 0 or a positive value and an operation result of said second operation circuit is 0 and if said D-type flip-flop latches an instruction signal instructing adjustment of said first control signal, generates an instruction signal instructing adjustment of said second control signal if the operation result of said first operation circuit is a negative value and the operation result of said second operation circuit is 0 and if said D-type flip-flop latches an instruction signal instructing adjustment of said first control signal, generates an instruction signal instructing adjustment of said second control signal if the operation result of said first operation circuit is 0 and the operation result of said second operation circuit is 0 or a negative value and if said D-type flip-flop latches an instruction signal instructing adjustment of said second control signal, and generates an instruction signal instructing adjustment of said first control signal if the operation result of said first operation circuit is 0 and the operation result of said second operation circuit is a positive value and if said D-type flip-flop latches an instruction signal instructing adjustment of said second control signal; and said control signal adjustment circuit adjusts one of the value of said first control signal and the value of said second control signal based on said instruction signal.

9. The automatic gain control circuit according to claim 7, wherein when the gain of said first automatic gain control amplifier decreases as said first control signal controlled by said control signal adjustment circuit increases, and the gain of said second automatic gain control amplifier decreases as said second control signal controlled by said control signal adjustment circuit increases, said adjustment instruction circuit includes a determination signal generation circuit generating a determination signal indicating whether adjustment of the value of said first control signal or adjustment of the value of said second control signal should be performed, an instruction signal generation circuit generating an instruction signal instructing adjustment of the value of said first control signal when said determination signal generation circuit generates a determination signal urging adjustment of the value of said first control signal continuously over at least a prescribed number of times, and generating an instruction signal instructing adjustment of the value of said second control signal when said determination signal generation circuit generates a determination signal urging adjustment of the value of said second control signal continuously over at least a prescribed number of times, a first operation circuit subtracting the value of said first control signal from said first control value, a second operation circuit subtracting the value of said second control signal from said second control value, and a D-type flip-flop latching said determination signal;

said determination signal generation circuit generates a determination signal urging adjustment of said first control signal if an operation result of said first operation circuit is 0 or a positive value and an operation result of said second operation circuit is 0 and if said D-type flip-flop latches a determination signal urging adjustment of said first control signal, generates a determination signal urging adjustment of said second control signal if the operation result of said first operation circuit is a negative value and the operation result of said second operation circuit is 0 and if said D-type flip-flop latches a determination signal urging adjustment of said first control signal, generates a determination signal urging adjustment of said second control signal if the operation result of said first operation circuit is 0 and the operation result of said second operation circuit is 0 or a negative value and if said D-type flip-flop latches a determination signal urging adjustment of said second control signal, and generates a determination signal urging adjustment of said first control signal if the operation result of said first operation circuit is 0 and the operation result of said second operation circuit is a positive value and if said D-type flip-flop latches a determination signal urging adjustment of said second control signal; and said control signal adjustment circuit adjusts one of the value of said first control signal and the value of said second control signal based on said instruction signal.

10. An automatic gain control circuit controlling a gain of a receiver including a first automatic gain control amplifier amplifying a RF signal and a second automatic gain control amplifier amplifying an IF signal, comprising:

a control signal adjustment circuit adjusting a value of a first control signal controlling either one of the first automatic gain control amplifier and the second automatic gain control amplifier and adjusting a value of a second control signal controlling a gain of the other one of said first and second automatic gain control amplifiers; and an adjustment instruction circuit instructing adjustment of the value of said second control signal if the value of said first control signal is past a first control value as a result of said control signal adjustment circuit adjusting the value of said first control signal such that a gain of an automatic gain control amplifier controlled by said first control signal decreases, and instructing adjustment of the value of said first control signal if the value of said second control signal is past a second control value as a result of said control signal adjustment circuit adjusting the value of said second control signal such that a gain of an automatic gain control amplifier controlled by said second control signal increases, said control signal adjustment circuit fixing the value of said first control signal at a third control value while adjusting the value of said second control signal if an instruction is given to adjust the value of said second control signal, a gain of an automatic gain control amplifier controlled by said first control signal being higher at said third control value than at said first control value, and said adjustment control circuit fixing the value of said second control signal at a fourth control value while adjusting the value of said first control signal if an instruction is given to adjust the value of said first control signal, a gain of an automatic gain control amplifier controlled by said second signal being lower at said fourth control value than at said second control value.

11. The automatic gain control circuit according to claim 10, wherein when a gain of said first automatic gain control amplifier decreases as said first control signal controlled by said control signal adjustment circuit increases, said adjustment instruction circuit includes an operation circuit adding said third control value to a first offset value, a circuit determining whether or not the addition result is past a maximum value of said first control signal, and a selector setting said addition result as said first control value if it is equal to or lower than the maximum value and setting said third control value as said first control value if it is past the maximum value.

12. The automatic gain control circuit according to claim 10, when a gain of said first automatic gain control amplifier decreases as said first control signal controlled by said control signal adjustment circuit increases, said adjustment instruction circuit includes an operation circuit adding said third control value to a first offset value, a circuit determining whether or not the addition result is past a maximum value of said first control signal, and a selector setting said addition result as said first control value if said addition result is equal to or lower than the maximum value, and setting said maximum value as said first control value if said addition result is past the maximum value.

13. The automatic gain control circuit according to claim 12, wherein when a gain of said second automatic gain control amplifier decreases as the value of said second control signal controlled by said control signal adjustment circuit increases, said adjustment instruction circuit includes an operation circuit subtracting a second offset value from said fourth controlled value, a circuit to determine whether or not the subtraction result is lower than a minimum value of said second control signal, and a selector setting said subtraction result as said second control value if the subtraction result is equal to or higher than the minimum value and setting said fourth control value as said second control value if the subtraction result is lower than the minimum value.

14. The automatic gain control circuit according to claim 10, wherein when a gain of said second automatic gain control amplifier decreases as the value of said second control signal controlled by said control signal adjustment circuit increases, said adjustment instruction circuit includes an operation circuit subtracting a second offset value from said fourth control value, a circuit determining whether or not the subtraction result is lower than a minimum value of said second control signal, and a selector setting said subtraction result as said second control value if the subtraction result is equal to or higher than the minimum value and setting said minimum value as said second control value if the subtraction result is lower than the minimum value.

* * * * *